(12) United States Patent
Sharma et al.

(10) Patent No.: US 12,512,365 B2
(45) Date of Patent: Dec. 30, 2025

(54) INTEGRATED CIRCUIT INTERCONNECT STRUCTURES WITH A METAL CHALCOGENIDE LINER

(71) Applicant: Intel Corporation, Santa Clara, CA (US)

(72) Inventors: Abhishek Anil Sharma, Portland, OR (US); Wilfred Gomes, Portland, OR (US); Pushkar Ranade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 685 days.

(21) Appl. No.: 17/711,892

(22) Filed: Apr. 1, 2022

(65) Prior Publication Data
US 2023/0317517 A1    Oct. 5, 2023

(51) Int. Cl.
*H01L 21/768* (2006.01)
*H01L 23/44* (2006.01)
*H01L 23/532* (2006.01)

(52) U.S. Cl.
CPC .. *H01L 21/76843* (2013.01); *H01L 21/76873* (2013.01); *H01L 21/76877* (2013.01); *H01L 23/44* (2013.01); *H01L 23/53238* (2013.01)

(58) Field of Classification Search
CPC ......... H01L 21/76843; H01L 21/76873; H01L 21/76877; H01L 23/44; H01L 23/53238; H01L 21/76807; H01L 21/76852; H01L 21/76856; H01L 21/76885; H01L 23/445; H01L 23/473
See application file for complete search history.

(56) References Cited

U.S. PATENT DOCUMENTS

| | | | |
|---|---|---|---|
| 2017/0133298 A1* | 5/2017 | Gutala | H01L 23/467 |
| 2023/0120110 A1* | 4/2023 | Motoyama | H01L 21/76885 257/774 |

OTHER PUBLICATIONS

U.S. Appl. No. 17/087,519, filed Nov. 2, 2020.
U.S. Appl. No. 17/087,521, filed Nov. 2, 2020.
U.S. Appl. No. 17/560,069, filed Dec. 22, 2021.
U.S. Appl. No. 17/560,089, filed Dec. 22, 2021.

* cited by examiner

*Primary Examiner* — Karen Kusumakar
(74) *Attorney, Agent, or Firm* — Essential Patents Group, LLP

(57) ABSTRACT

Integrated circuit interconnect structures including an interconnect metallization feature comprising a sidewall reacted with a chalcogen into a low resistance liner. A portion of a backbone material or a metal seed layer may be advantageously converted into a metal chalcogenide, which can lower scattering resistance of an interconnect feature relative to alternative diffusion barrier materials, such a tantalum. Scattering resistance of such metal chalcogenide liner materials may be further reduced by actively cooling an IC, for example to cryogenic temperatures.

20 Claims, 24 Drawing Sheets

INTEGRATED CIRCUIT INTERCONNECT STRUCTURES WITH A METAL CHALCOGENIDE LINER

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay product associated with interconnects of an IC increases with the density of the interconnects.

FIG. 1A illustrates a conventional interconnect structure that includes a metal line 101 within a first interconnect level. A transverse width of metal line 101 has some lateral critical dimension CD1. A dielectric material 102 is over metal line 101, and a "via" 103 and a "trench" 106 is subtractively patterned through dielectric material 102 in the z-dimension to expose a portion of metal line 101.

As further illustrated in FIG. 1B, trench 106 is filled with one or more metals to form an interconnect line 108 that extends in the x-y dimension to intersect conductive material in via 103 so that two interconnect levels are electrically connected. In this example, a liner material 105 is on a bottom and a sidewall of trench 106 and/or interconnect line 108. Liner material 105 may include a barrier material to prevent diffusion/migration of a bulk material 107 out of the interconnect structure, as any loss of bulk material 107 can be catastrophic to an integrated circuit. Liner material may also include an adhesion material instead of a barrier material, or in addition to a barrier material. An adhesion material is to improve adhesion of a bulk material 107 that would otherwise suffer poor adhesion with an underlying material, such as a barrier material, and/or dielectric material 102.

Interconnect line architectures, and techniques for forming such line architectures, that can reduce the electrical resistance through interconnect line 108 and into interconnect line 101 through via 103 are commercially advantageous at least for their associated reduction in RC delay.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
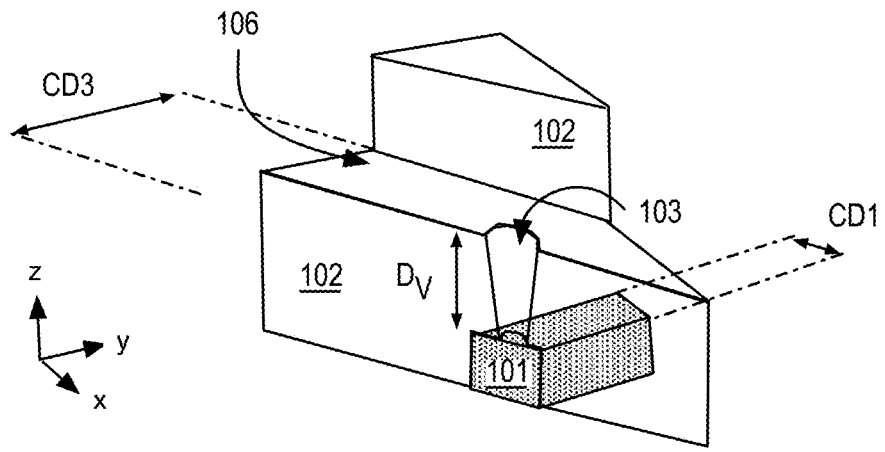
FIGS. 1A and 1B illustrate isometric cross-sectional views of an IC interconnect structure, in accordance with convention.
Figure 1B:
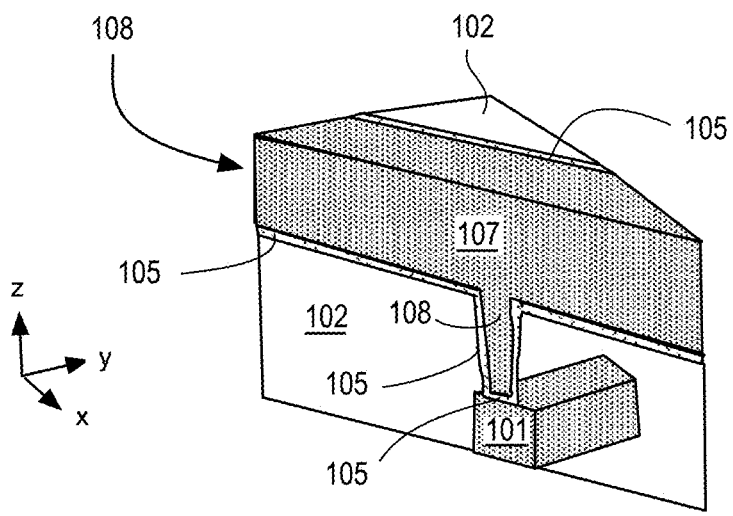

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials, where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

As described below, one or more chalcogenation techniques may be integrated into an interconnect fabrication process to form a two-dimension (2D) interconnect liner in a manner that can reduce electrical resistance relative to metallization features with conventional liners with a barrier material of poorer electrical conductivity. Chalcogenation of a sidewall portion of a bulk material or a seed layer can lower scattering resistance of the feature relative to alternatives with a barrier material of tantalum or tantalum nitride. As described further below, chalcogenation of the bulk material may advantageously crystallize the bulk material to form a barrier comprising a chalcogenide having metal homogeneity with a fill metal adjacent to the barrier, or to form a barrier comprising a chalcogenide with metal heterogeneity with the fill metal adjacent to the barrier. As also described below, chalcogenation of a sidewall portion of a bulk metal in accordance with some embodiments herein may incur a negligible interconnect fill volume penalty because a sidewall of a bulk material adjacent to a patterned interconnect feature is converted into metal chalcogenide liner as opposed to filling some portion of the patterned interconnect feature with a liner material.

The advantages of 2D interconnect liners described herein can be extended by implementing such liners within an IC that is to operate well below standard temperature (20° C.), and potentially at cryogenic temperatures (<−70° C.). At such low temperatures, scattering resistance associated with the 2D interconnect liners described herein becomes much lower than at typical IC operating conditions exceeding standard temperature (e.g., >50° C.). Hence, the 2D interconnect liners described herein can synergistically enhance IC performance gains in some specific embodiments where the IC is to be actively cooled to very low temperatures.

Figure 2:
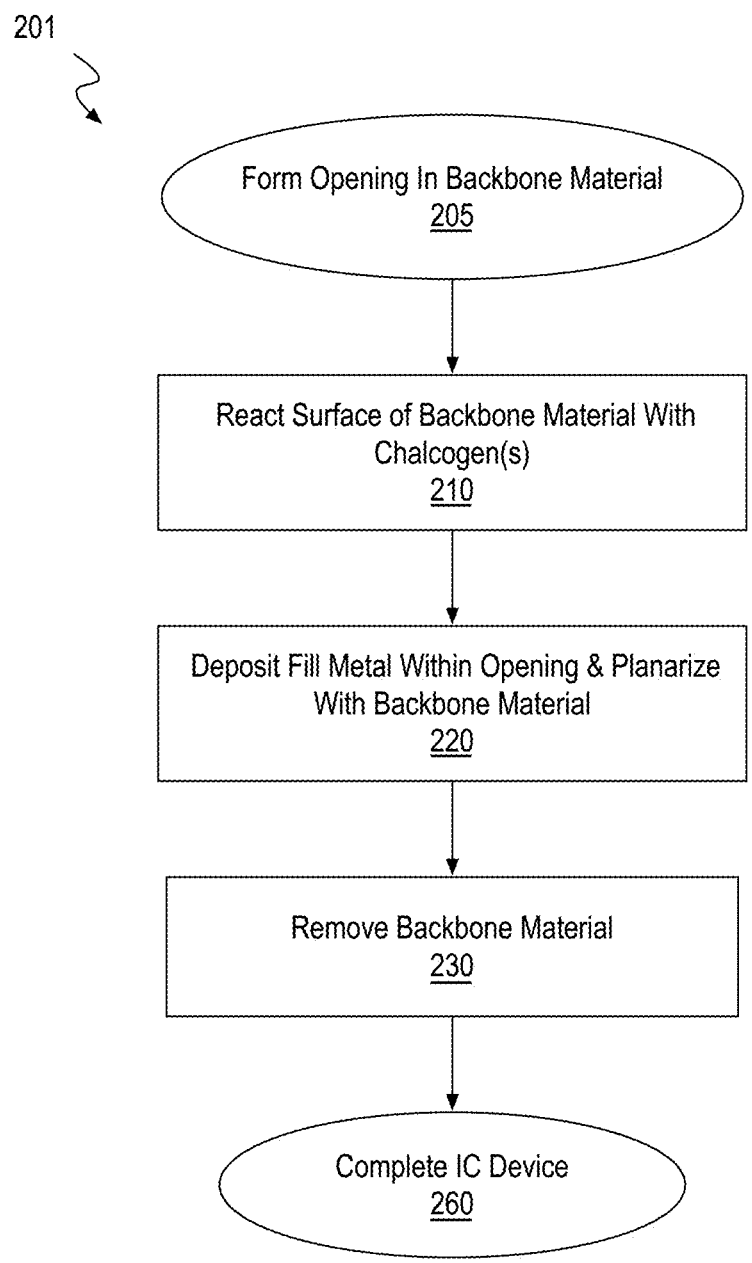
FIG. 2 is a flow chart of methods of fabricating one level of an integrated circuit interconnect structure comprising a metal chalcogenide liner, in accordance with some embodiments.

FIG. 2 is a flow chart of methods 201 for fabricating one level of an integrated circuit interconnect structure having a low resistance 2D metal chalcogenide liner, in accordance with some embodiments. Methods 201 may be practiced on a workpiece, such as a large format (e.g., 300-450 mm) semiconductor wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more underlying device layers including a semiconductor material layer, and may also have one or more interconnect levels interconnecting devices (e.g., transistors) of the devices layers.

Methods 201 begin at operation 205 where an opening is subtractively patterned into one or more backbone materials. The opening may be any via or trench type opening in a backbone material that exposes an underlying metallization feature previously fabricated into the workpiece or exposes an etch stop layer that can be subsequently removed to expose the underlying metallization feature. In methods 201, the backbone material comprises one or more metals and may, for example, be predominantly a transition metal that is suitable for forming a metal chalcogenide, such as a metal dichalcogenide.

Figure 3A:
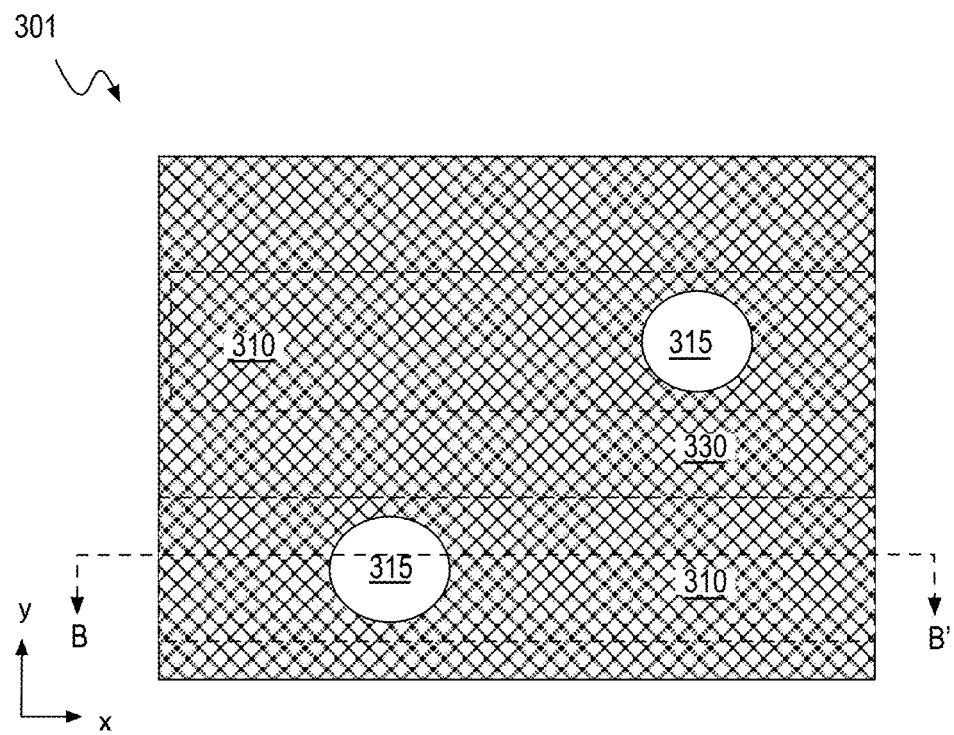
FIGS. 3A, 4A, 5A, and 6A illustrate a plan view of a portion of an IC interconnect structure evolving as the methods illustrated in FIG. 2 are practiced, in accordance with some single-damascene embodiments.
Figure 3B:
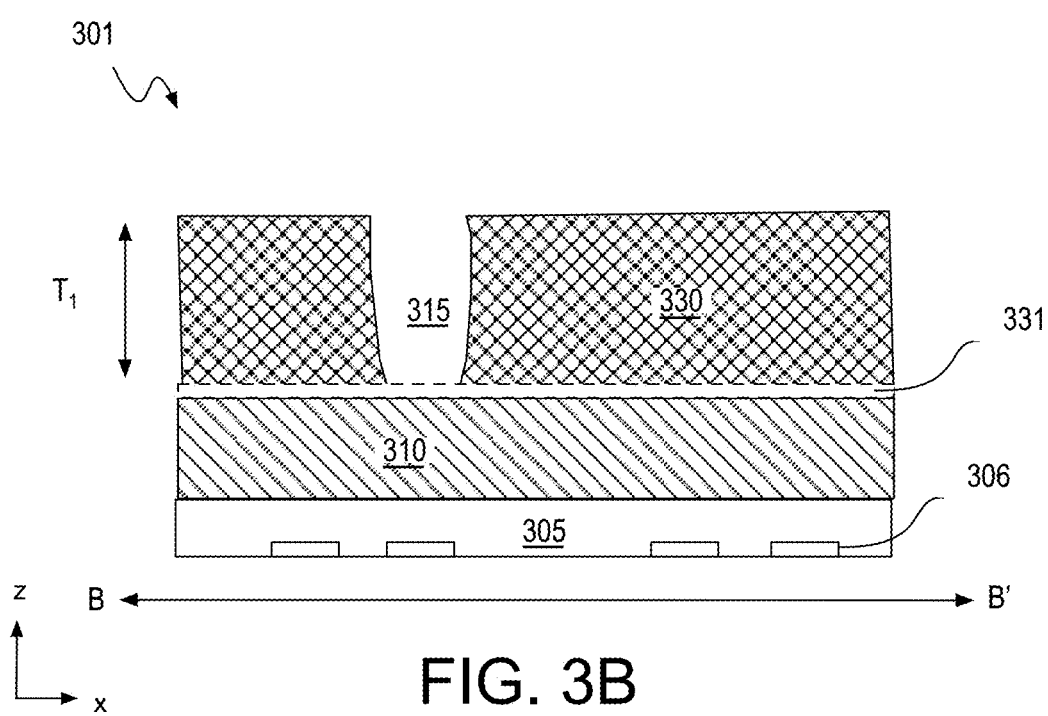
FIGS. 3B, 4B, 5B and 6B illustrate a cross-sectional view of a portion of the IC interconnect structure illustrated in FIG. 3A-6A, respectively, in accordance with some embodiments.
Figure 4A:
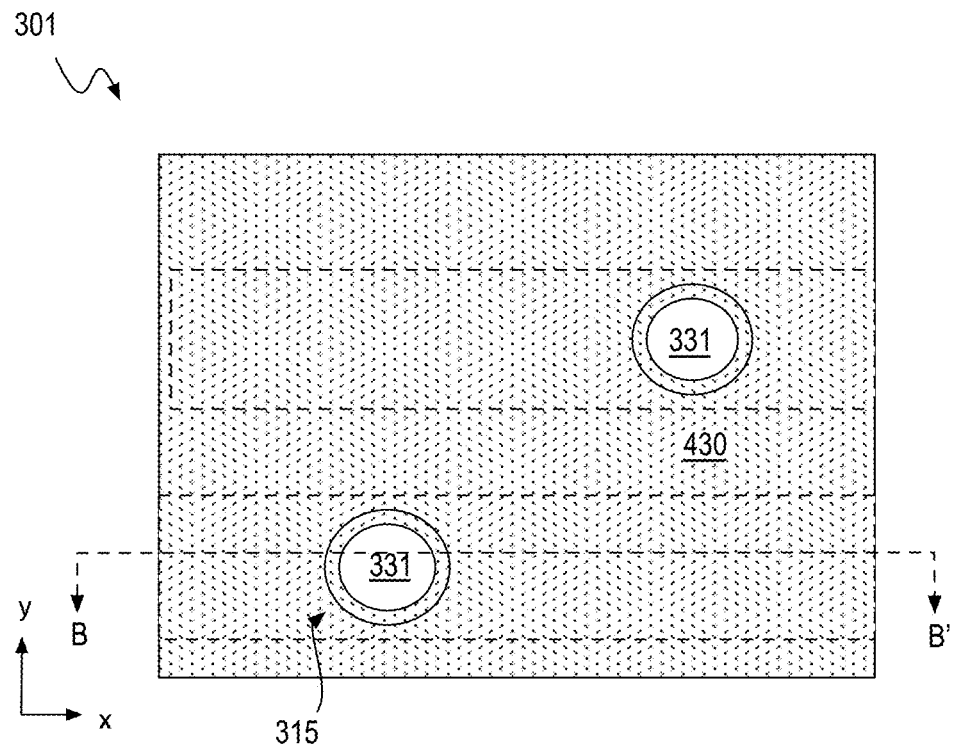
Figure 4B:
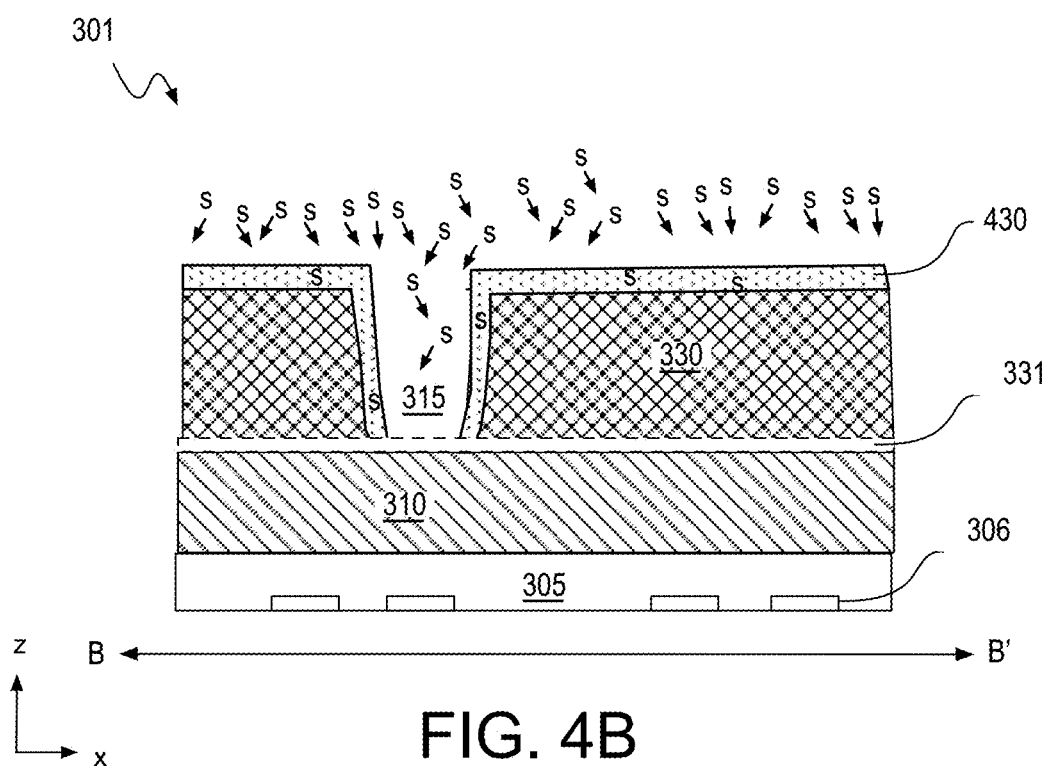
Figure 5A:
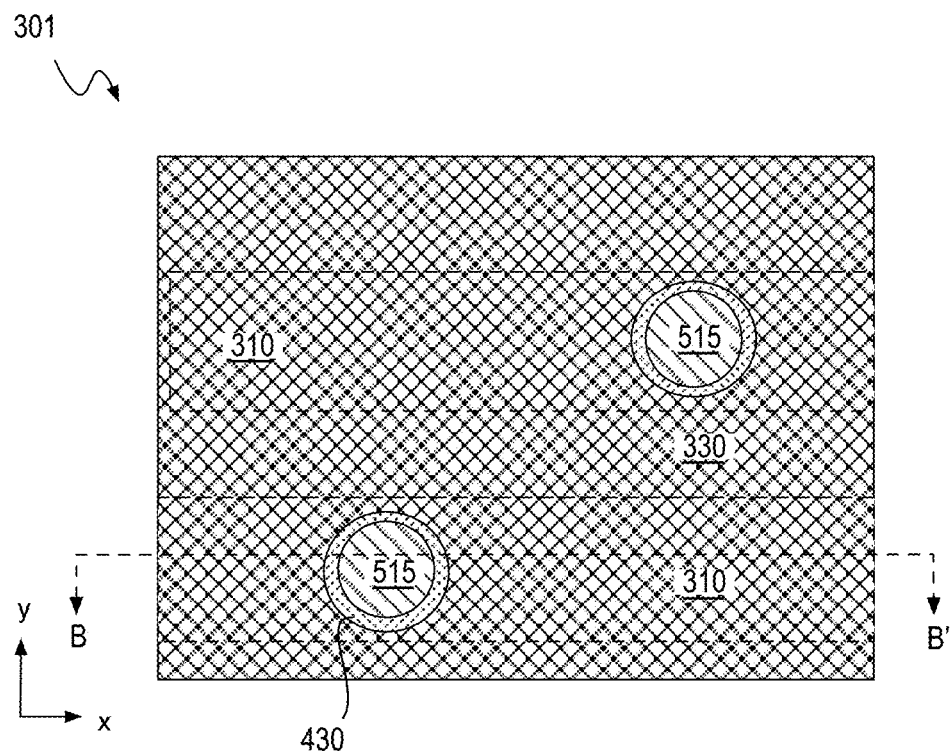
Figure 5B:
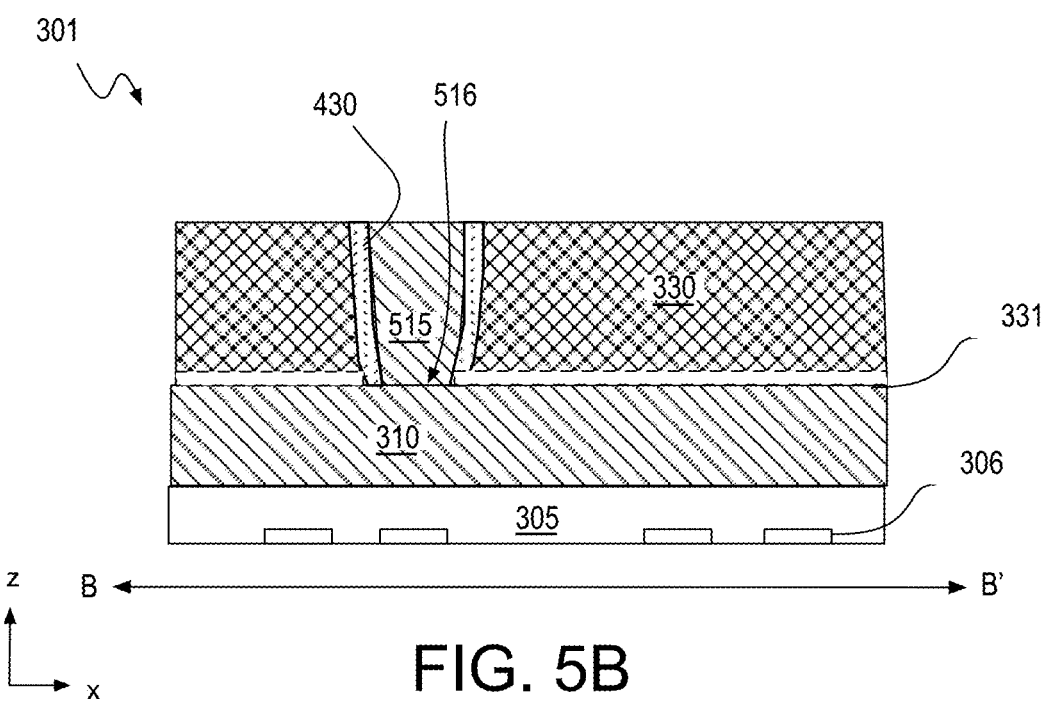

FIG. 3A, 4A, 5A illustrate a plan view of an IC interconnect structure portion 301 evolving as the methods 201 are practiced, in accordance with some embodiments. FIGS. 3B, 4B and 5B further illustrate a cross-sectional view of IC interconnect structure portion 301 evolving, in accordance with some embodiments.

Referring first to FIG. 3A and FIG. 3B, interconnect structure portion 301 includes an opening 315 through a thickness T1 of a backbone material 330. Thickness T1 may vary with implementation, but in some exemplary embodiments is 10 nm-50 nm. An underlying metallization feature (e.g., a line) 310 is exposed at a bottom of opening 315. Metallization feature 310 is in a lower interconnect level below backbone material 330. Metallization feature 310 may have any composition, with some examples including copper (Cu), tungsten (W), titanium (Ti), cobalt (Co), ruthenium (Ru), manganese (Mn), or aluminum (Al). In FIG. 3A, portions of metallization feature 310 outlined in dashed line are below the surface.

Backbone material 330 comprises a transition metal suitable for patterning opening 315 and suitable as a precursor of a metal chalcogenide. In some exemplary embodiments, backbone materials 330 comprise predominantly one of Mo, W, Ru, Re, Co, Ir, Rh, Pt, Pd, or Al. In this example, opening 315 exposes an etch stop material layer 331 at the bottom of opening 315. Each stop material layer 331 is between backbone material 330 and underlying materials, such as metallization feature 310 and any adjacent dielectric material(s). Etch stop material layer 331 is illustrated in dashed line to emphasize it is optional. Although the composition of etch stop material layer 331 may vary with the composition of backbone material 330, in some exemplary embodiments etch stop material layer 331 comprises nitrogen and silicon (e.g., SiN or $SiO_xN_y$).

Any single-step or multi-step anisotropic reactive ion etch (RIE) process (e.g., based on a $S_xF_y$ plasma chemistry) may be practiced to form opening 315, as embodiments are not limited in this respect. Opening 315 is depicted with a tapered sidewall and positive slope such that a top width of opening 315 is slightly larger than the bottom width. While such tapered slope is representative of subtractively patterned materials, other profiles are possible as a function of the etch process.

As further shown in FIG. 3B, interconnect structure portion 301 is over a portion of an underlying substrate that includes a device layer 305. Within device layer 305 are a plurality of devices 306. In exemplary embodiments, devices 306 are metal-oxide-semiconductor field effect transistor (MOSFET) structures. However, devices 306 may also be other transistor types, such as, but not limited to other FET architectures, or bipolar junction transistors. Devices 306 may also be other devices that include one or more semiconductor junctions (e.g., diodes, etc.).

Returning to FIG. 2, methods 201 continue at block 210 where a surface of the backbone material is reacted with one or more chalcogens to convert a surface thickness of the backbone material into a metal chalcogenide, such as a metal dichalcogenide. Through the reaction at block 210, a portion of the backbone material comprising a metal M is doped with a chalcogen C (i.e., a chalcogen-doped metal M:C). In some examples, block 210 comprises heating the workpiece to over 100° C. (e.g., 125° C., 150° C., 200° C., or 250° C.) while a surface of the backbone material is exposed to a chalcogenide precursor gas. Within the backbone material, the chalcogen dopant concentration may therefore be highest proximal to the surface and decline with distance from the surface.

Chalcogens include sulfur, selenium or tellurium (oxygen is excluded). The precursor gas may have various compositions, with some examples including $H_2S$, $H_2Se$, $H_2Te$. These gaseous precursor compounds may readily degrade to their respective elements at the elevated temperature of the heated substrate. These exemplary precursor gases can also act as strong reducing agents, so they may be combined or replaced with weaker reducing agents/stronger oxidizing agents. Gases including oxygen, for example, temper the reducing strength more than those that lack oxygen. In some embodiments, $SO_2$ or $SeO_2$ may be introduced in combination with, or to the exclusion of, $H_2S$ or $H_2Se$, for example. Other gases, such as, $NH_3$, $N_2$, Ar, $N_2O$, or $S_xO_y$, $Se_xO_y$, $Te_xO_y$ with x or y being 1, 2 (e.g., $SO_2$, $SeO_2$) or 3, or $SF_z$, $Se_z$ or $Te_z$ with z either 4 or 6 (e.g., $SF_6$, $TeF_6$) may also be introduced in combination with one or more of $H_2S$ and, $H_2Se$ and or $H_2Te$. For the duration of block 210 the chalcogen(s) diffuse into the backbone material(s), doping the backbone material(s) to some peak concentration within a certain distance from the surface.

A transient thermal process may be performed at block 210 to convert a portion of the chalcogen-doped backbone material M:C into a metal chalcogenide (e.g., MG). The transient thermal process may be a furnace anneal, a flash anneal, or laser anneal, for example. A furnace anneal (or other anneal) may be performed in a forming gas or other ambient at a predetermined temperature and duration sufficient to react the backbone material(s) within regions having a sufficiently high concentration of chalcogen doping into the metal chalcogenide. Where chalcogen doping is insufficient to form the metal chalcogenide, the chalcogen dopant may migrate toward the metal chalcogenide, feeding the conversion. In some embodiments, the anneal is performed at a temperature compatible with backend processing (e.g., <400° C.). In some embodiments, the anneal performed at block 210 is at a higher temperature than the temperature at which the chalcogen dopant is introduced into the backbone materials. For example, where a chalcogen dopant is introduced into backbone material of predominantly W at a temperature less than 250° C., the subsequently performed anneal is at a temperature of 250-350° C.

FIG. 4A and FIG. 4B further illustrates chalcogen doping of interconnect structure portion 301, for example according to the techniques described above in the context of block 210 (FIG. 2). Notably, chalcogenation of backbone material 330 forms liner 430 outside of the diameter of opening 315 as opposed occupying some portion of the interior volume of opening 315. Hence, nearly the full diameter of opening 315 remains available to be filled in with a subsequently deposited fill metal.

Although sulfur ("S") is shown in FIG. 4B, selenium may also be introduced, for example in conjunction with S, or in the alternative to S. Likewise, tellurium may also be introduced. Interconnect structure portion 301 now includes a liner 430 comprising a metal chalcogenide ($MC_x$) in direct contact with backbone materials 330. Although liner 430 may be a dichalcogenide ($MC_2$) in some instances, liner 430 need not be a dichalcogenide because several oxidation states are possible such that x may vary, for example between about 0.2 and 4 in the metal chalcogenide compound $MC_x$. Consistent with metal dichalcogenides, liner 430 may have crystalline microstructure within a 2D plane of its monolayer(s), and low electron surface scattering qualities of liner 430 may be attributable, at least in part, to this crystalline microstructure. One or more analysis techniques, such a transmission electron microscopy (TEM) coupled with XPS, EDX, or Raman spectroscopy may be employed to identify the presence of particular metal(s) and chalcogen(s) within liner 430, as well as quantify the crystal structure of liner 430 (e.g., from Raman peak widths).

Although liner 430 is not limited to a single monolayer, in accordance with some exemplary embodiments liner 430 has a thickness less than 8 nm along a sidewall of opening 315. Liner 430 may be advantageously less than 6 nm (e.g., 2-5 nm) to minimize feature electrical resistance attributable to the liner. Liner 430 may therefore advantageously have a thickness of two-six molecular monolayers, each of which comprises a chalcogen atomic layer between two metal atomic layers. Liner 430 may be considered a 2D material as a result of crystalline microstructure (i.e., long range atomic ordering) within a 2D plane of each molecular monolayer that is substantially parallel to the sidewall of opening 315.

In some examples where the backbone material 330 is predominantly W, a liner comprising a W chalcogenide is formed adjacent to a sidewall of opening 315. Exemplary W chalcogenides include $WS_x$, $WSe_x$, $WSe_xS_y$, $WTe_x$, or $WSe_x$-$Te_y$. In other embodiments where backbone material 330 is an alternative metal, (e.g., predominantly Mo, Ru, Re, Co, Ir, Rh, Pt, Pd, Al, etc.), the corresponding alternative metal chalcogenide (e.g., $MoS_x$, $RuS_x$, $ReS_x$, $CoS_x$, $IrS_x$, $RhS_x$, $PtS_x$, $PdS_x$, $AlS_x$, etc.) may be similarly formed within a liner thickness of backbone material 330.

As shown in FIGS. 4A and 4B, etch stop material layer 331 may prohibit the formation of liner 430 at the bottom of opening 315. Etch stop material layer 331 may be retained through the formation of liner 430 where liner 430 will not provide an interface with metallization feature 310 that is as electrically conductive as an alternative interface formed in the absence of liner 430. For such embodiments, etch stop material layer 331 may be removed (e.g., with a short selective blanket etch process) immediately following the formation of liner 430. If metallization feature 310 either forms a sufficiently conductive metal chalcogenide or is of a composition that does not form a metal chalcogenide at the bottom of opening 315 when exposed to the process that forms liner 430 from backbone material 330, etch stop material layer 331 may be completely absent or removed from the bottom of opening 315 prior to the formation of liner 430.

Returning to FIG. 2, methods 201 continue at block 220 where a fill metal is deposited with the opening. The fill metal may be deposited by any suitable deposition process and any overburden associated with that deposition process may be removed by a planarization process where fill metal within the opening is planarized with a surface of the adjacent backbone material(s). Any deposition process known to be suitable for depositing a particular metal into an opening may be practiced at block 220 as embodiments herein are not limited in this respect. In some examples, an electrolytic plating process is practiced at block 220 to deposit a fill metal. In further embodiments, multiple deposition processes may be practiced at block 220. For example, an electrolytic plating process may be preceded by physical vapor deposition (PVD) of a seed layer. Deposition of the bulk materials may also comprise PVD, chemical vapor deposition (CVD), atomic layer deposition (ALD), or electroless plating. In some further examples, a wetting material layer may be deposited by PVD, CVD, ALD or electroless plating prior to an electrolytic plating of a bulk material comprising predominantly copper (Cu). Although the deposition of Cu is one exemplary embodiment, other metals may be deposited at block 220. For example, one or more of Mo, W, Ru, Re, Co, Ir, Rh, Pt, Pd or Al may be deposited in the alternative to Cu, or in conjunction with Cu.

FIGS. 5A and 5B further illustrate a metal fill of openings in interconnect structure portion 301, for example according to the techniques described above in the context of block 220 (FIG. 2). As shown in FIGS. 5A and 5B, a fill metal 515 has been deposited within opening 315 so that a sidewall of fill metal 515 is in direct contact with liner 430. Liner 430 is therefore between the sidewall of fill metal 515 and a sidewall of backbone material 330. In this example, fill metal 515 is in direct contact with metallization feature 310 at metallization feature interface 516. In some examples where liner 430 has lower electrical conductivity than fill metal 515, the absence of liner 430 at interface 516 ensures interface 516 is of low electrical resistance. As further illustrated, a top surface of fill metal 515 is substantially coplanar with a top surface of backbone material 330, for example after a planarization process has removed liner 430 to expose the top surface of backbone material 330.

Depending on the chemical composition of fill metal 515, liner 430 may be a homogeneous chalcogenide of the fill metal 515 (i.e., where the backbone material and the fill material comprised predominantly the same metal) or liner 430 may be a heterogeneous chalcogenide of a metal absent from fill metal 515 (i.e., where the backbone material and the fill material were of different compositions). In either case, liner 430 may offer good resistance to electromigration and/or resistance to outdiffustion of fill metal 515 and good electrical conductivity as a result of lower scattering resistance (particularly where an IC device is to be operated at cryogenic temperatures).

Returning to FIG. 2, methods 201 continue at block 230 where the backbone material is removed. The backbone material may be removed with any blanket etch process that is selective to the fill metal and metal chalcogenide liner of metallization features. Hence, backbone material is a sacrificial source of the metal chalcogenide converted into a liner of the metallization feature that is retained after removing the backbone material. Following removal of the backbone material, fabrication of an IC device is completed at output 260 where any process(es) may be practiced according to any known technique(s). In some examples, at least a dielectric material suitable for interconnect feature isolation is deposited over the metallization features. In further embodiments, any number of additional levels of metallization may be fabricated over the metallization features formed in blocks 205-230.

Figure 6A:
Figure 6B:

FIGS. 6A and 6B further illustrates interconnect structure portion 301 following the replacement of backbone material 330 with a dielectric material 630. As shown in FIGS. 6A and 6B, interconnect structure portion 301 now includes a metallization feature 611 that includes fill metal 515 surrounded by liner 430 that is along the sidewall of dielectric material 630 and the sidewall of metallization feature 611.

Dielectric material 630 may have any chemical composition known to be suitable as interlayer dielectric material (ILD). In some exemplary embodiments, dielectric material 630 is a low-k dielectric material, for example having a relative permittivity less than about 3.4. In other embodiments, dielectric material 630 is a conventional dielectric material having a somewhat higher relative permittivity in the range of 3.5-9. In some specific examples, dielectric material 630 is one of SiOC(H), hydrogen silsesquioxane, methyl silsesquioxane, polyimide, polynorbornene, benzocyclobutene $SiN_x$, $SiO_2$, $SiO_xN_y$, $HfO_2$, ZrO, or $Al_2O_3$. As again denoted by the dashed lines, etch stop material layer 331 may be retained as a film layer under dielectric material 630. Alternatively, etch stop material layer 331 may be removed, for example with the etch process that is practiced to remove backbone material 330. As further illustrated in FIG. 6B, another etch stop layer material 631 may be optionally deposited over dielectric material 630. Etch stop layer material 631 may have any of the compositions described above, and may have the same composition as etch stop material layer 331.

Methods 201 (FIG. 2) may be repeated, for example in the practice of single-damascene processes, to form another layer of metallization features in contact with metallization feature 611. An upper-level metallization feature formed over metallization feature 611 substantially as described above may include another liner from backbone material and a fill metal. That fill metal will be in direct contact with fill metal 515 where a second iteration of the liner is similarly formed only on sidewalls of the backbone material.

Figure 7:
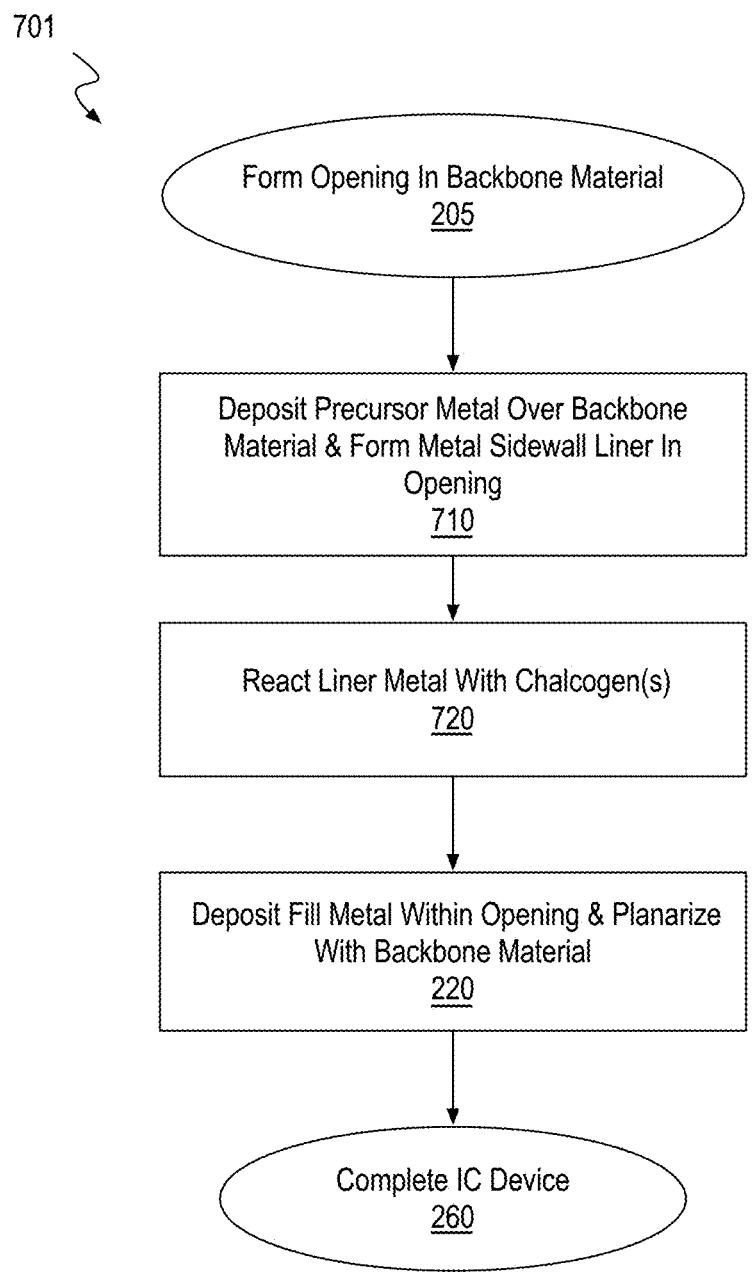
FIG. 7 is a flow chart of methods of fabricating one level of an integrated circuit interconnect structure comprising a metal chalcogenide liner, in accordance with some alternative embodiments.
Figure 8A:
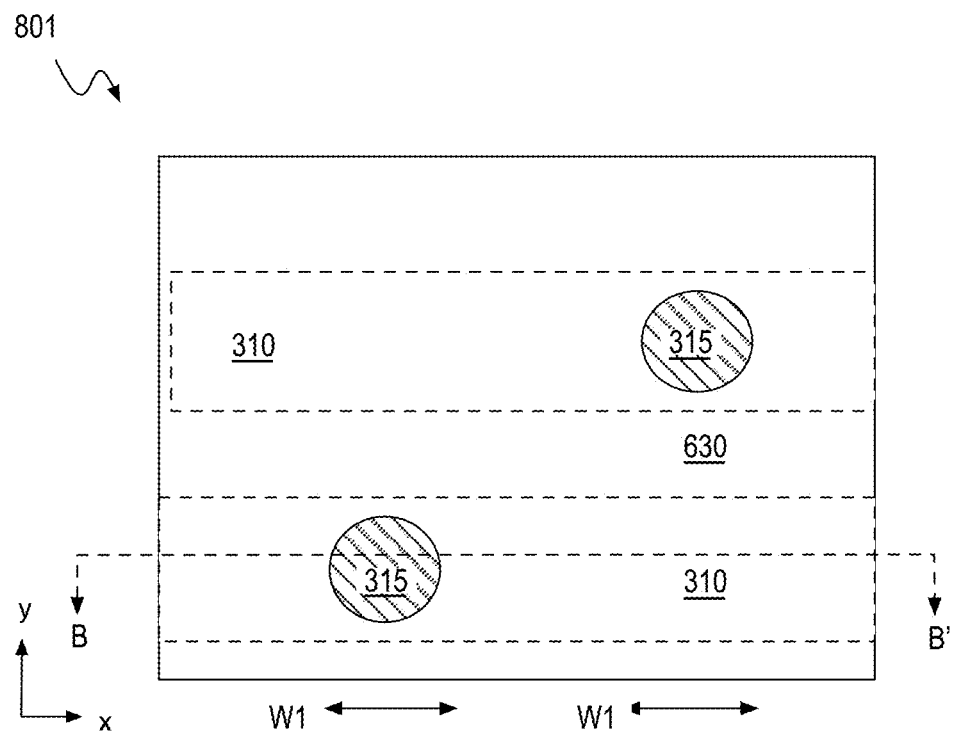
FIGS. 8A, 9A, 10A, and 11A illustrate a plan view of a portion of an IC interconnect structure evolving as the methods illustrated in FIG. 7 are practiced, in accordance with some single-damascene embodiments.
Figure 8B:
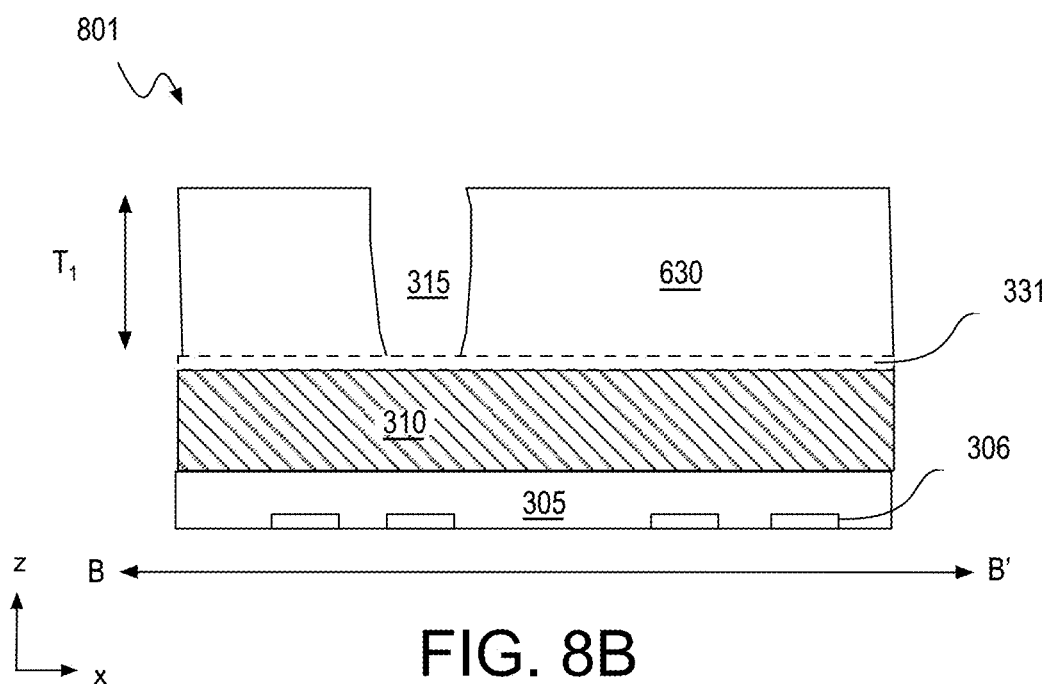
FIGS. 8B, 9B, 10B, and 11B illustrate a cross-sectional view of a portion of the IC interconnect structure illustrated in FIG. 8A-11A, in accordance with some embodiments.
Figure 9A:
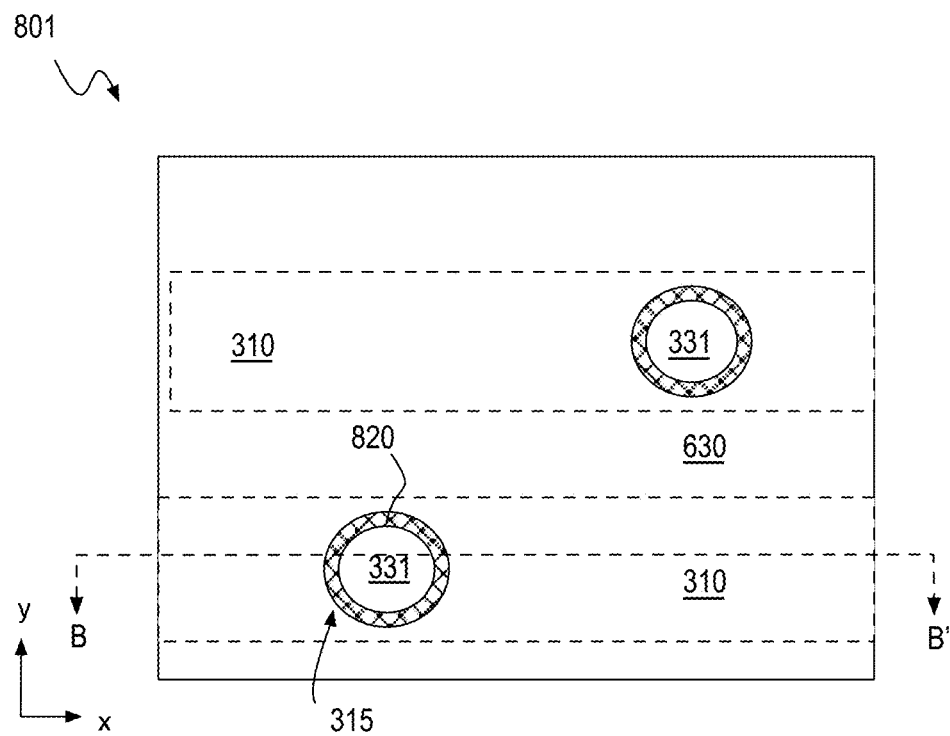
Figure 9B:
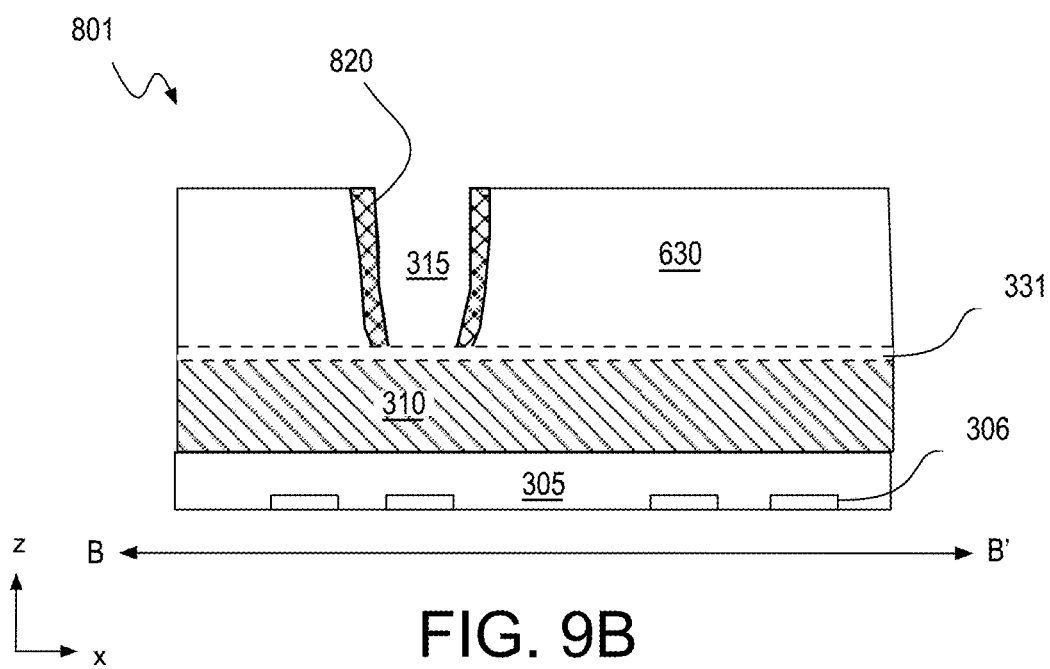
Figure 10A:
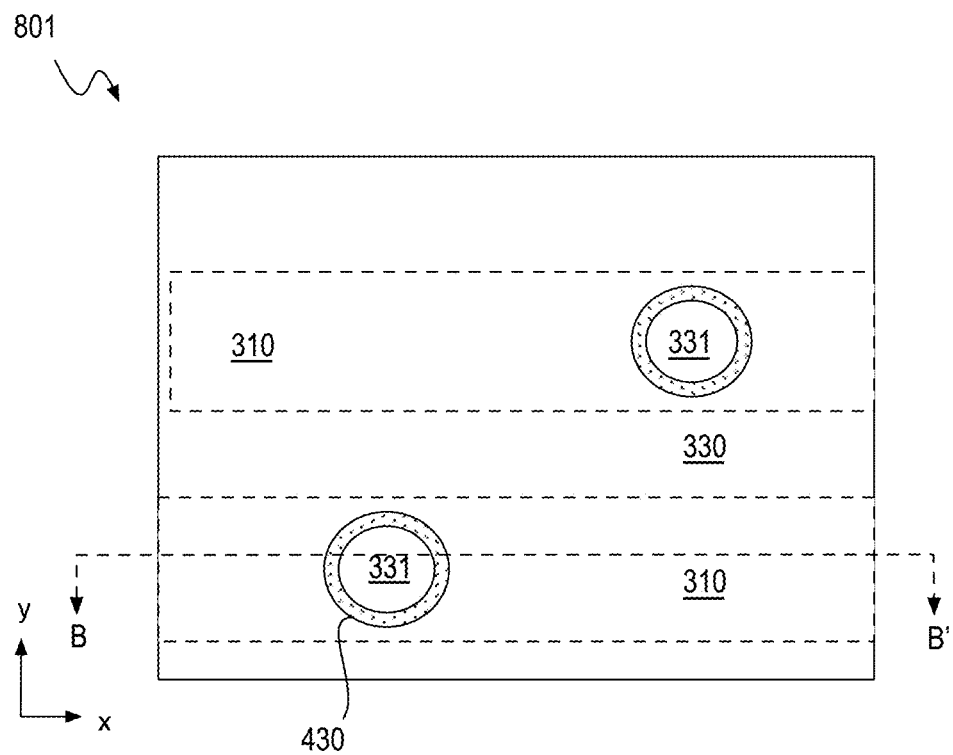
Figure 10B:
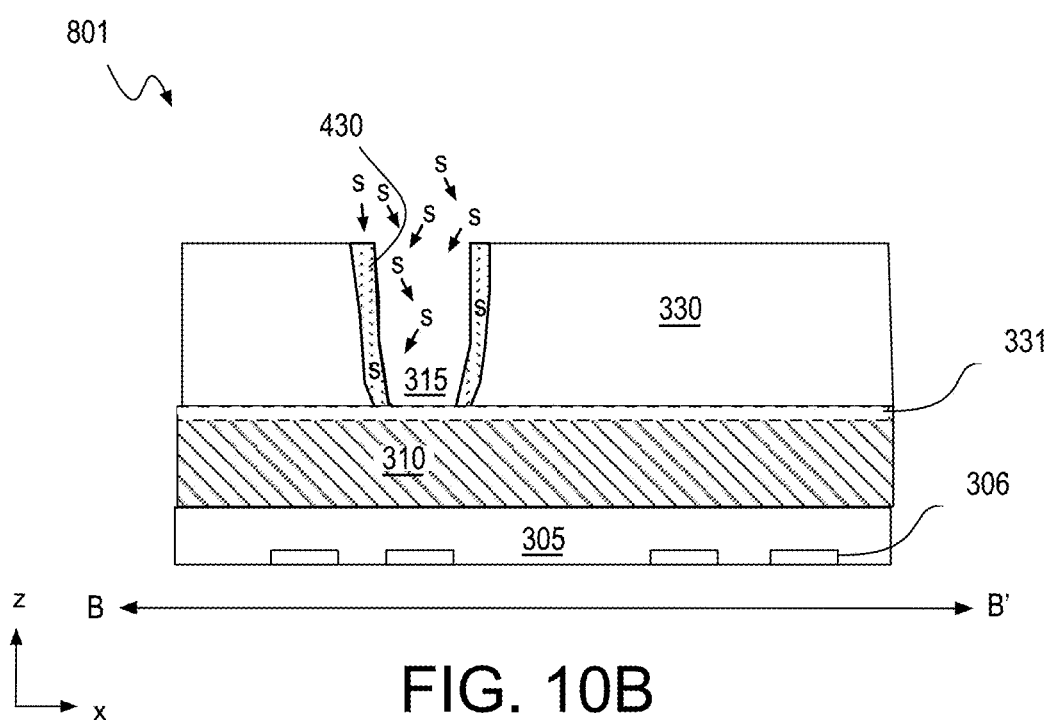

In accordance with some alternative embodiments, an interconnect metallization feature liner is a chalcogenide reaction product of a precursor metal deposited within openings patterned into a non-sacrificial backbone material that may be retained within an IC device. FIG. 7 is a flow chart of methods 701 for fabricating one level of an integrated circuit interconnect structure having a low resistance 2D metal chalcogenide liner. Reference numbers introduced in the context of methods 201 (FIG. 2) are retained in FIG. 7 where the attributes and features previously described are directly applicable to methods 701. FIGS. 8A, 9A and 10A illustrate a plan view of a portion of an IC interconnect structure portion 801 evolving as the methods 701 are practiced, in accordance with some embodiments. FIGS. 8B, 9B and 10B further illustrate a cross-sectional view of a portion of IC interconnect structure portion 801 evolving, in accordance with some embodiments. Reference numbers introduced in the context of IC interconnect structure portion 301 (FIG. 3-6) are retained in FIG. 8-10 where the attributes and features previously described are directly applicable to IC interconnect structure portion 801.

Referring first to FIG. 7, methods 701 again begin at input 205 where an opening is formed in a backbone material. The opening may be formed substantially as described above, however the backbone material may instead be of any composition suitable as an electrical insulator of interconnect metallization features. For example, the backbone material may be any suitable dielectric and patterning of the dielectric may comprise any single-step or multi-step anisotropic RIE process (e.g., based on a $C_xF_y$ plasma chemistry).

In the example illustrated in FIGS. 8A and 8B, opening 315 extends through thickness T1 of dielectric material 630. Opening 315 is again depicted with a tapered sidewall and positive slope such that a top width of via opening 315 is slightly larger than the bottom width. While such tapered slope is representative of subtractively patterned dielectrics, other profiles are possible as a function of the etch process. Etch stop material layer 331 is drawn in dashed line in FIG. 8A as being optional. If present, etch stop material layer 331 may be retained at the bottom of opening 315. If etch stop material layer 331 is absent, metallization feature 310 may be exposed at the bottom of opening 315.

Returning to FIG. 7, methods 701 continue at block 720 where a precursor metal is deposited over the backbone material and formed into a sidewall liner of the openings patterned in the backbone material. The precursor metal deposited at block 720 may be any transition metal suitable for forming a metal chalcogenide. For example, a film layer comprising any of the metals described above may be deposited at block 720. Following deposition of the precursor metal, the precursor metal may be optionally etched anisotropically to form a spacer located only along sidewalls of openings in the backbone material. Any portion of the precursor metal retained may then be reacted with one or more chalcogens, for example substantially as described above, to form a metal chalcogenide liner on the sidewall of the opening. A transient thermal process may be performed at block 720, for example substantially as described above for block 210 (FIG. 2) to convert a portion of the chalcogen-doped M:C material into a metal chalcogenide (e.g., $MC_x$) liner.

In the example shown in FIGS. 9A and 9B, interconnect structure portion 801 includes a precursor metal 820, which has been deposited upon dielectric material 630. Precursor metal 820 may be, for example, predominantly one of Mo, Cu, W, Ru, Re, Co, Ir, Rh, Pt, Pd, or Al. Following deposition, precursor metal 820 may be anisotropically etched to retain the metal only one the sidewall of dielectric material 630, lining opening 315. The anisotropic etch removes precursor metal 820 from the bottom of opening 315, exposing etch stop material layer 331 (if present). FIGS. 10A and 10B further illustrate interconnect structure portion 801 during a chalcogenation reaction where precursor metal 820 is doped with a chalcogen (e.g., S). The is doped material may then be further annealed to form liner 430, which comprises a metal chalcogenide.

As described above, liner 430 may be a dichalcogenide ($MC_2$) in some instances. Consistent with metal dichalcogenides, liner 430 may have crystalline microstructure within a 2D plane of its monolayer(s), and low electron surface scattering qualities of liner 430 may be attributable, at least in part, to this crystalline microstructure. In some examples where the precursor metal 820 is predominantly W, liner 430 comprises a W chalcogenide such as $WS_x$, $WSe_x$, $WSe_xS_y$, $WTe_x$, or $WSe_xTe_y$. In other embodiments where precursor metal 820 is an alternative metal, (e.g., predominantly Mo, Ru, Re, Co, Ir, Rh, Pt, Pd, Al, etc.), the corresponding alternative metal chalcogenide (e.g., $MoS_x$, $RuS_x$, $ReS_x$, $CoS_x$, $IrS_x$, $RhS_x$, $PtS_x$, $PdS_x$, $AlS_x$, etc.) may be formed as liner 430.

As further shown in FIGS. 10A and 10B, etch stop material layer 331 may prohibit the formation of liner 430 at the bottom of opening 315. Etch stop material layer 331 may be retained through the formation of liner 430 if liner 430 cannot provide an interface with metallization feature 310 that is as electrically conductive as an alternative interface formed in the absence of liner 430. For such embodiments, etch stop material layer 331 may be removed (e.g., with a short selective blanket etch process) following the formation of liner 430. If metallization feature 310 instead forms a sufficiently conductive metal chalcogenide or is of a composition that does not form a metal chalcogenide at the bottom of opening 315 when exposed to the chalcogenation process that forms liner 430 from precursor metal 820, etch stop material layer 331 may be completely absent or removed from the bottom of opening 315 prior to the formation of liner 430.

Returning to FIG. 7, methods 701 continue at block 220 where a fill metal is deposited at block 220 (e.g., substantially as described above) to be in direct contact with underlying metallization feature 310. Following deposition, the fill metal may be planarized with a surface of the surrounding backbone material. Methods 701 may then be end at output 260 where an IC device may be completed according to any known fabrication techniques, for example to form additional layers of metallization features.

Figure 11A:
Figure 11A:
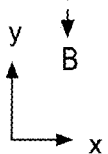
Figure 11A:
Figure 11B:
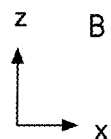
Figure 11B:

In the example illustrated in FIGS. 11A and 11B, IC interconnect structure portion 801 includes metallization feature 611 substantially as described above for IC interconnect structure portion 301 depicted in FIGS. 6A and 6B, respectively. As shown, fill metal 515 is in direct contact with a metallization feature 310 at metallization interface 516. Liner 430 is therefore only on sidewalls of fill metal 515. Depending on the chemical composition of fill metal 515, liner 430 may be a homogeneous chalcogenide that comprises one or more metal constituents present in the fill metal 515 (i.e., where the backbone material and the fill material comprised predominantly the same metal). Alternatively, liner 430 may be a heterogeneous chalcogenide that comprises a metal absent from fill metal 515 (i.e., where the backbone material and the fill material were of different compositions). In either case, liner 430 may provide good resistance to electromigration, and high resistance to out-diffusion of fill metal 515, and good electrical conductivity as a result of lower scattering resistance (particularly where an IC device is to be operated at cryogenic temperatures).

As illustrated in FIG. 11B, another etch stop layer material 631 may be optionally deposited over dielectric material 630. Etch stop layer material 631 may have any of the compositions described above and may have the same composition as etch stop material layer 331. Methods 701 (FIG. 7) may be repeated, for example in the practice of single-damascene processes, to form another layer of metallization features in contact with metallization feature 611. An upper-level metallization feature formed over metallization feature 611 substantially as described above may include another liner and fill metal. That fill metal will be in direct contact with fill metal 515 where a second iteration of liner 430 is formed only on sidewalls of the upper-level metallization feature.

As noted above, a 2D metal chalcogenide liner may be present at an interface between two levels of metallization features where that liner has sufficient high electrical conductivity. For example, in methods 201 (FIG. 2) where no etch stop material layer is present, chalcogenation of the backbone material may also chalcogenate a top surface of the underlying metallization resulting in a metal chalcogenide between two levels of fill metal. Similarly, in methods 701 (FIG. 7) where the precursor metal is not anisotropically etched to form a sidewall spacer, a portion of the precursor metal at the bottom of the opening may also form a metal chalcogenide between two levels of fill metal.

Figure 12:
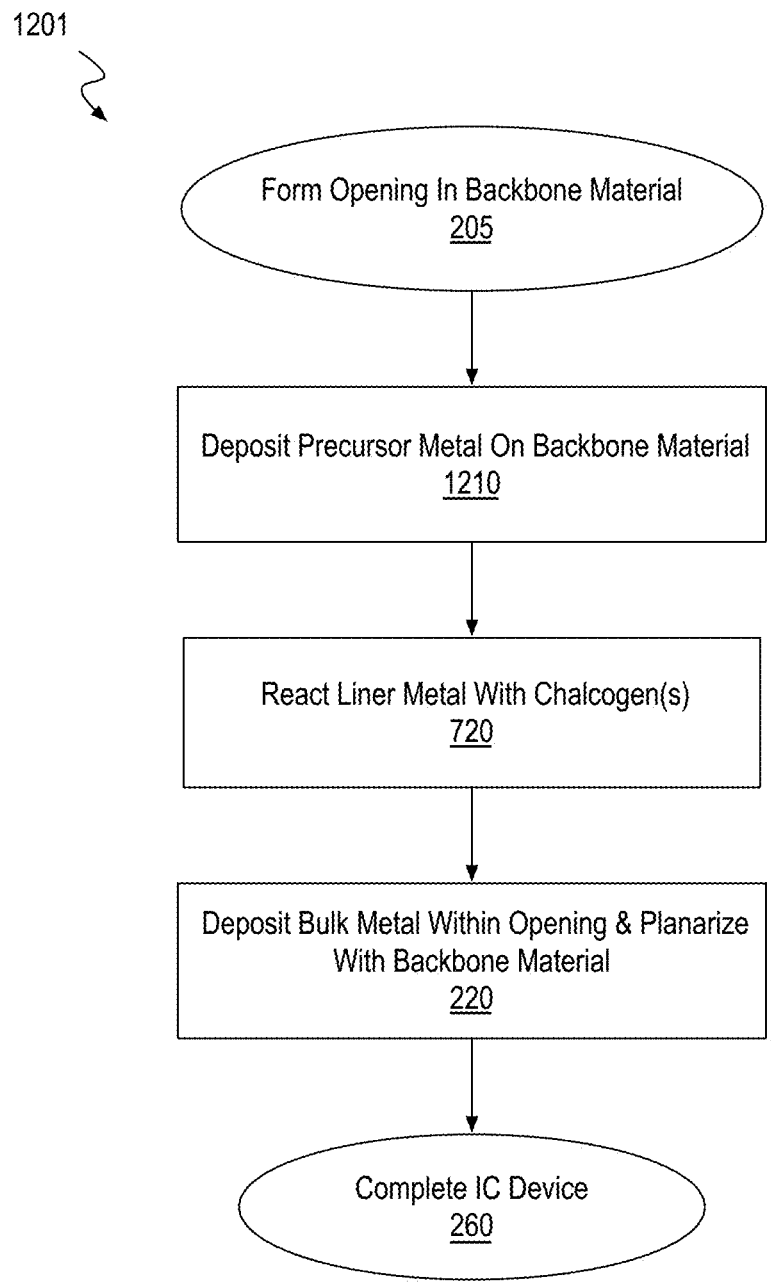
FIG. 12 is a flow chart of methods of fabricating one level of an integrated circuit interconnect structure comprising a metal chalcogenide liner, in accordance with some alternative embodiments.

FIG. 12 is a flow chart of methods 1201 for fabricating one level of an integrated circuit interconnect structure having a low resistance 2D metal chalcogenide liner, in accordance with some embodiments where the liner is again a chalcogenide reaction product of a precursor metal deposited within openings patterned into a backbone material. However, in methods 1201 the precursor metal is more specifically a seed layer facilitating the subsequent deposition of a fill metal (e.g., by electrolytic plating). Reference numbers introduced in the context of methods 201 (FIG. 2) or 701 (FIG. 7) are retained in FIG. 12 where the attributes and features previously described are directly applicable to methods 1201.

Methods 1201 begin at input 205 where an opening is patterned into a backbone material. In exemplary embodiments, the backbone material is non-sacrificial and may have any composition suitable for electrical isolation of interconnect metallization features. Any lithography and/or etch patterning process(es) may be practiced at input 205. In some embodiments, a dual damascene patterning process is practiced to form both via and trench openings. In other embodiments, a single damascene patterning process is practiced to form either one of a via opening or a trench opening.

Figure 13A:
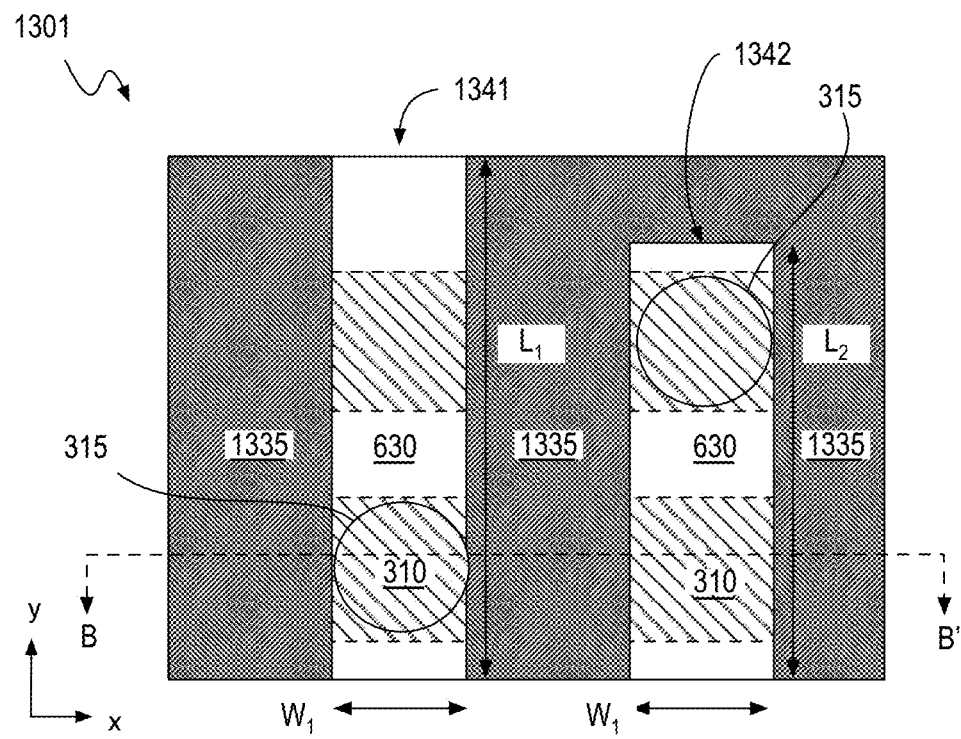
FIGS. 13A, 14A, and 15A illustrate a plan view of a portion of an IC interconnect structure evolving as the methods illustrated in FIG. 12 are practiced, in accordance with some dual-damascene embodiments.
Figure 13B:
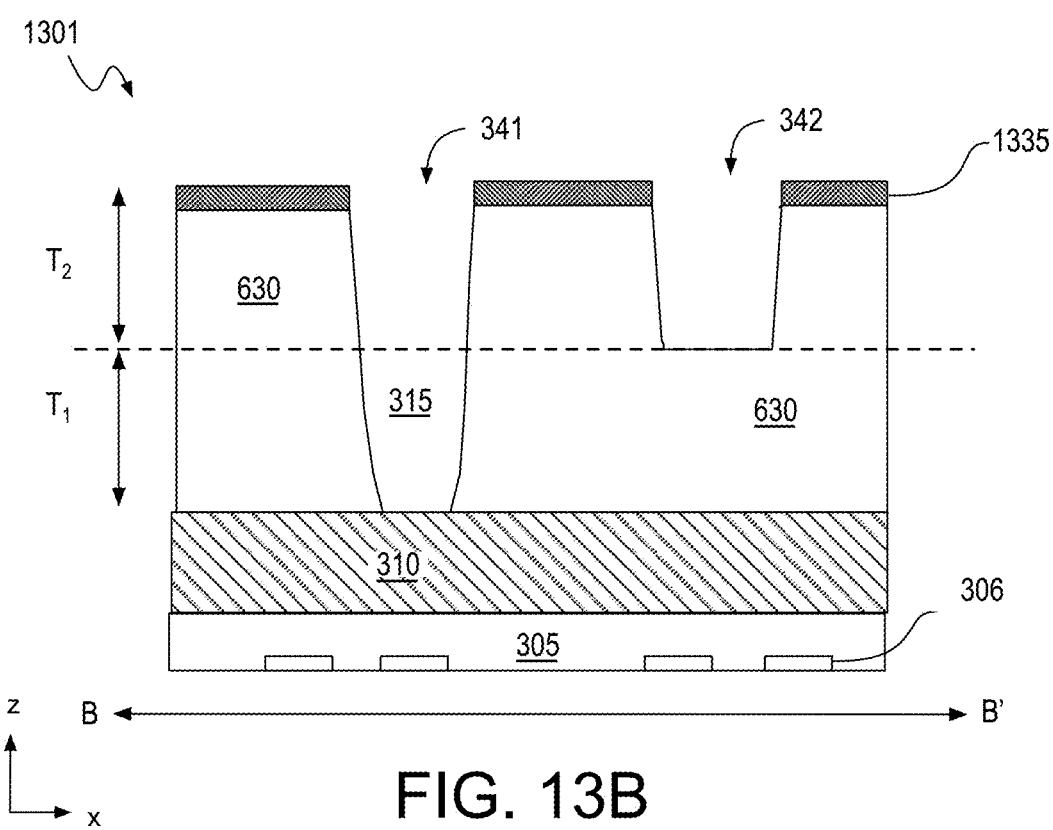
FIGS. 13B, 14B, and 15B illustrate a cross-sectional view of a portion of the IC interconnect structure illustrated in FIG. 13A-15A, in accordance with some embodiments.
Figure 14A:
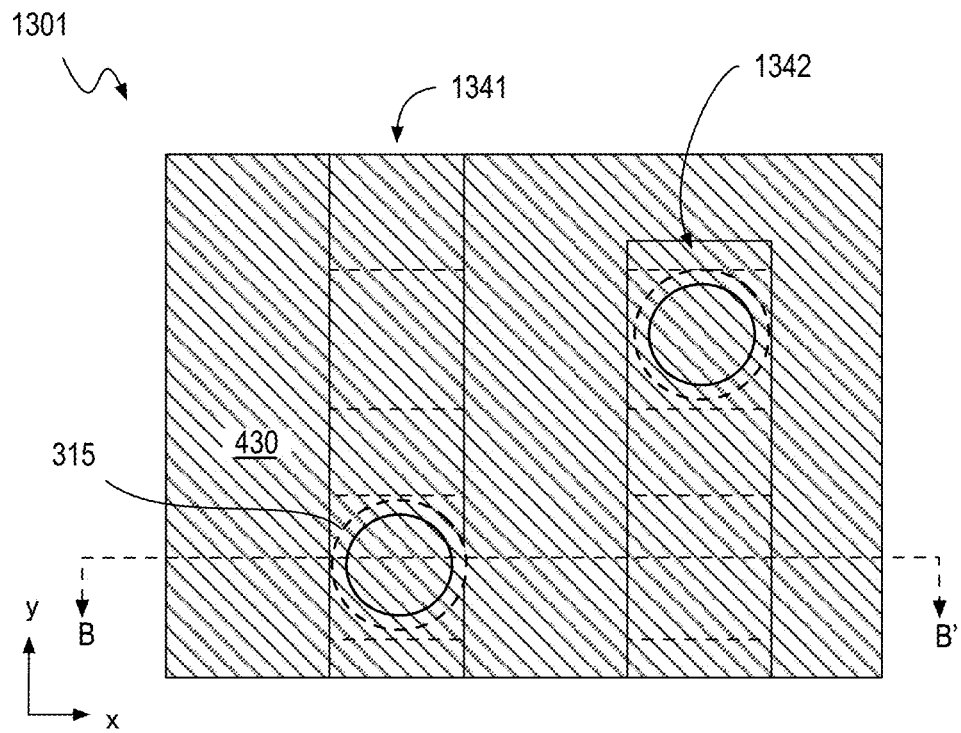
Figure 14B:
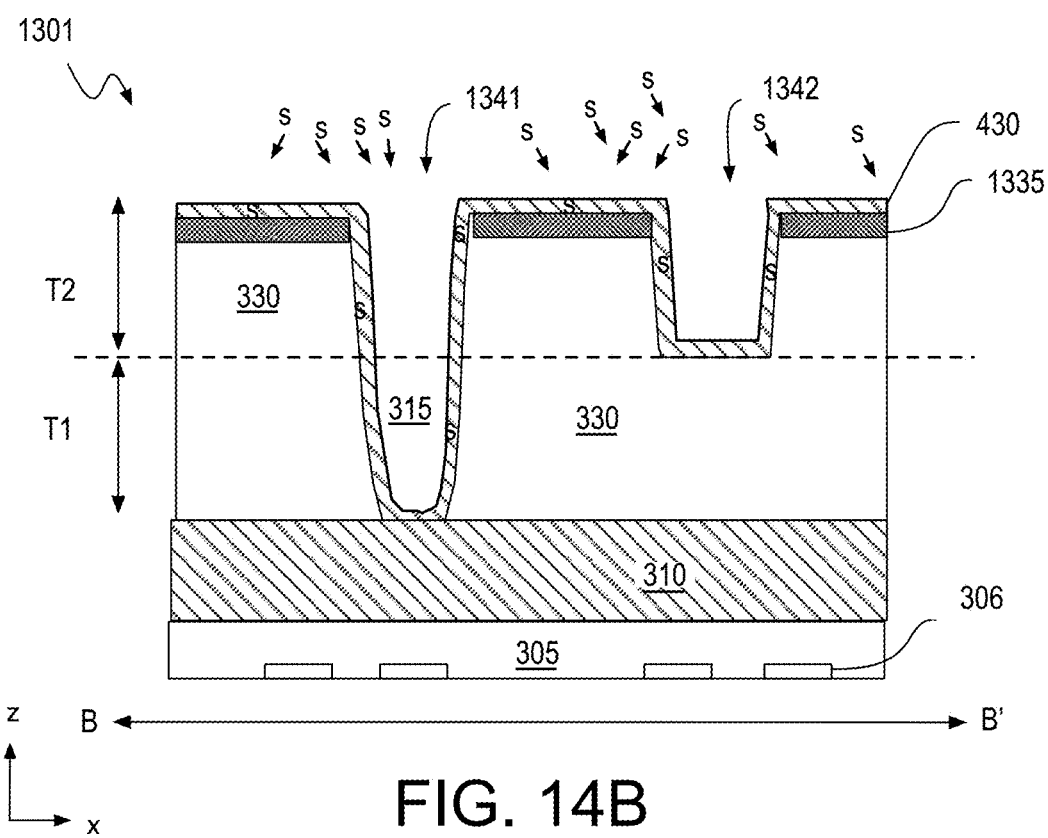
Figure 15A:
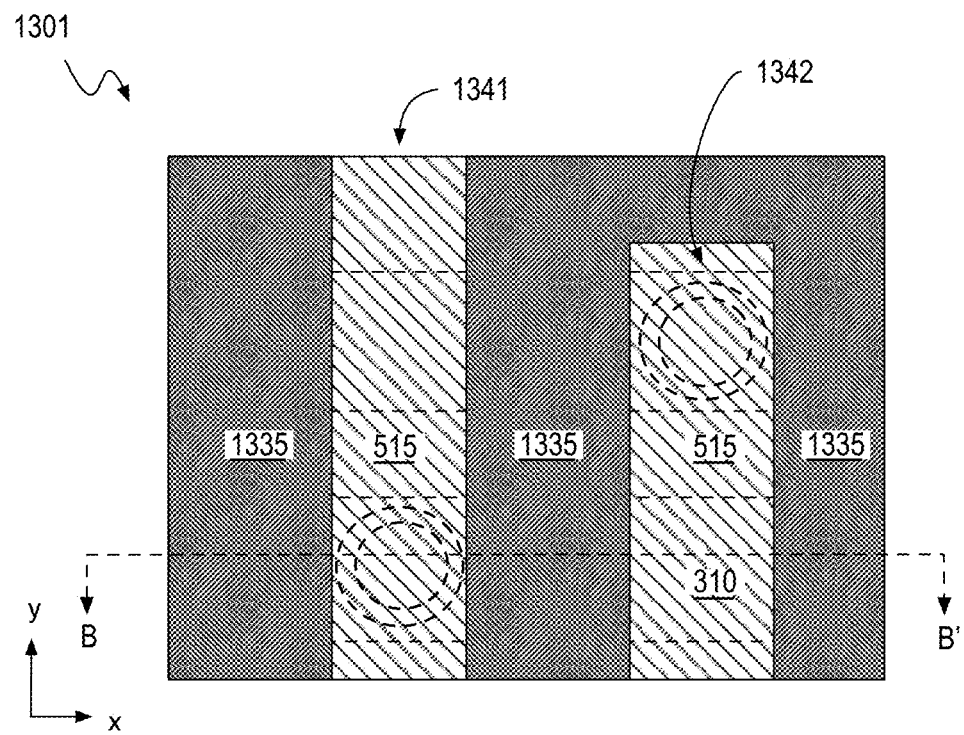

FIGS. 13A, 14A and 15A illustrate a plan view of a portion of an IC interconnect structure portion 1301 evolving as the methods 1201 are practiced, in accordance with some dual-damascene embodiments. FIGS. 13B, 14B and 14B further illustrate a cross-sectional view of IC interconnect structure portion 1301 evolving, in accordance with some embodiments. Reference numbers introduced in the context of IC interconnect structure portions 301 or 801 are retained in FIG. 13-15 where the attributes and features previously described are directly applicable to IC interconnect structure portion 1301.

As shown in FIGS. 13A and 13B, interconnect structure portion 1301 includes a trench opening 1341 within a thickness T2 of dielectric material 630 over opening 315 within thickness T1. Thickness T2 may vary with implementation, but in some exemplary embodiments is 10-50 nm, or more. Another trench 1342 laterally spaced apart from trench 1341 is further illustrated, and the cross-section of trench 1342 shown in FIG. 13B is representative of a cross-section of trench 1341 out of the plane of the FIG. 13B where there is no opening 315. As shown in FIG. 13A, trench 1341 has a longitudinal length $L_1$ and a transverse width $W_1$. In exemplary embodiments, longitudinal length $L_1$ is significantly (e.g., 3×) larger than transverse width $W_1$. Although not illustrated, trench 1341 has ends somewhere beyond the perimeter of interconnect structure portion 1301. Trench 1342 is substantially parallel to trench 1341, but with a shorter longitudinal length $L_2$ to further illustrate a trench end. An etch stop material layer 1335 is over dielectric materials 630, surrounding trenches 1341, 1342. Opening 315 has a maximum lateral diameter $D_0$, which may vary with implementation, but is generally significantly smaller than the length of a trench (e.g., diameter Do is significantly smaller than longitudinal lengths $L_1$ and $L_2$).

Any single-step or multi-step anisotropic RIE process (e.g., based on a $C_xF_y$ plasma chemistry) may have been practiced to form trench openings 1341, 1342 and 315, as embodiments are not limited in this respect. Openings 1341, 1342 and 315 are depicted with a tapered sidewall and positive slope such that a top width of each of opening is slightly larger than the bottom width. While the tapered slope is representative of subtractively patterned dielectrics, other profiles are possible as a function of the etch process.

Returning to FIG. 12, methods 1201 continue at block 1210 where a precursor metal is deposited on the patterned backbone material. Any precursor metal suitable for chalcogenation, such as any of those described above in the context of block 710 (FIG. 7), may be deposited at block 1210 (FIG. 12). Any deposition process known to be suitable for depositing a particular precursor metal into patterned openings may be practiced at operation 1210 as embodiments herein are not limited in this respect. The precursor metal may be deposited non-selectively, in which case the precursor metal also accumulates on surfaces of any metallization exposed within the opening. The precursor metal may be deposited to any thickness that will be functional as a barrier layer and/or adhesion layer. In some embodiments, the precursor metal deposited at block 1210 is also to be functional as a seed layer for a fill metal subsequently deposited, and so may advantageously comprise predominantly Cu. Methods 1201 continue at block 720 where the precursor metal is reacted with one or more chalcogen(s), for example substantially as described above in the context of methods 701 (FIG. 7). A fill metal is then deposited within the openings and planarized with the backbone material at block 220, for example according to any dual damascene techniques. Methods 1201 then end at output 260 where the IC device fabrication may be completed, for example by performing methods 1201 again to form additional levels of interconnect metallization features.

FIGS. 14A and 14B illustrate an example where interconnect structure portion 1301 includes liner 430 comprising a metal chalcogenide along both a sidewall and bottom of openings 1341, 1342 and 315. Liner 430 may have any of the metal chalcogenide compositions described above, and in some exemplary embodiments is predominantly Cu and at least one of S or Se. Following a high temperature thermal treatment, for example to convert the microstructure of liner 430 into that of a 2D metal dichalcogenide with Cu atomic layers between chalcogen atomic layers, a fill metal may be deposited over liner 430.

Figure 15B:
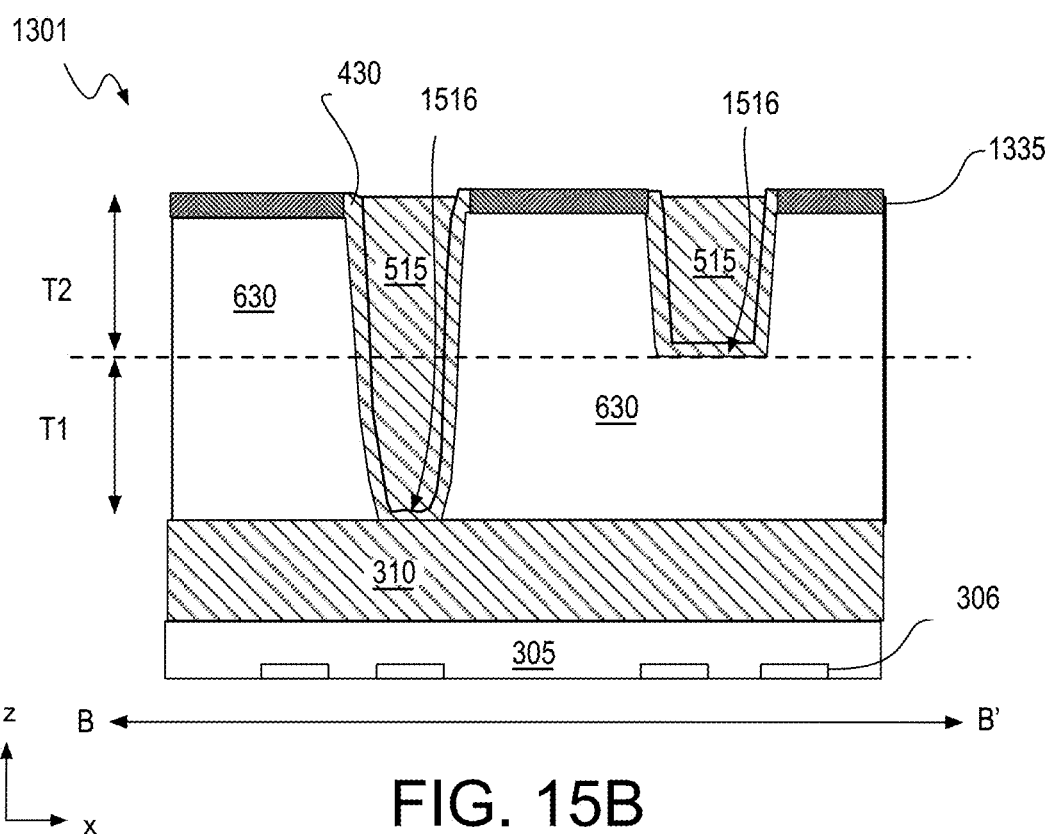

As further shown in FIGS. 15A and 15B, fill metal 515 has been deposited into both via and trench openings. Overburden from the plating process has been removed, for example with a planarization process, to expose etch stop material layer 1335. In some examples, fill metal 515 is predominantly Cu, which has been deposited by an electrolytic plating process relying on liner 430 as a seed layer. For such embodiments, liner 430 is a homogeneous chalcogenide comprising the same metal (e.g., Cu) as fill metal 515. In the illustrated embodiment, liner 430 is between fill metal 515 and underlying metallization 310 at the via bottom interface 1516.

Figure 16A:
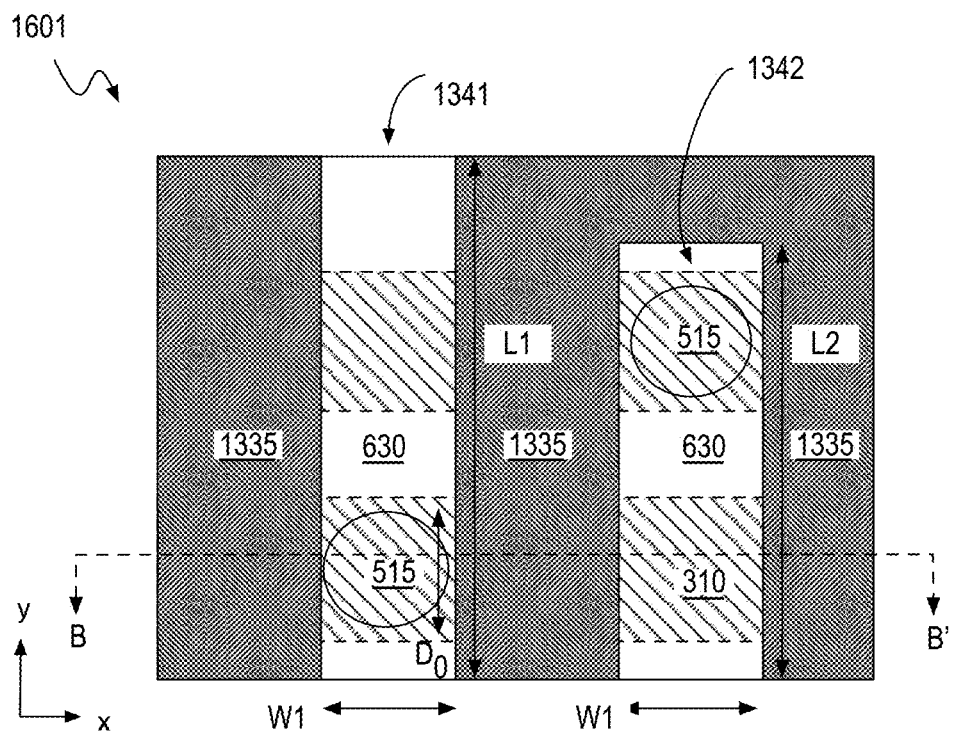
FIGS. 16A, 17A, and 18A illustrate a plan view of a portion of an IC interconnect structure evolving as the methods illustrated in FIG. 12 are practiced, in accordance with some single-damascene embodiments.
Figure 16B:
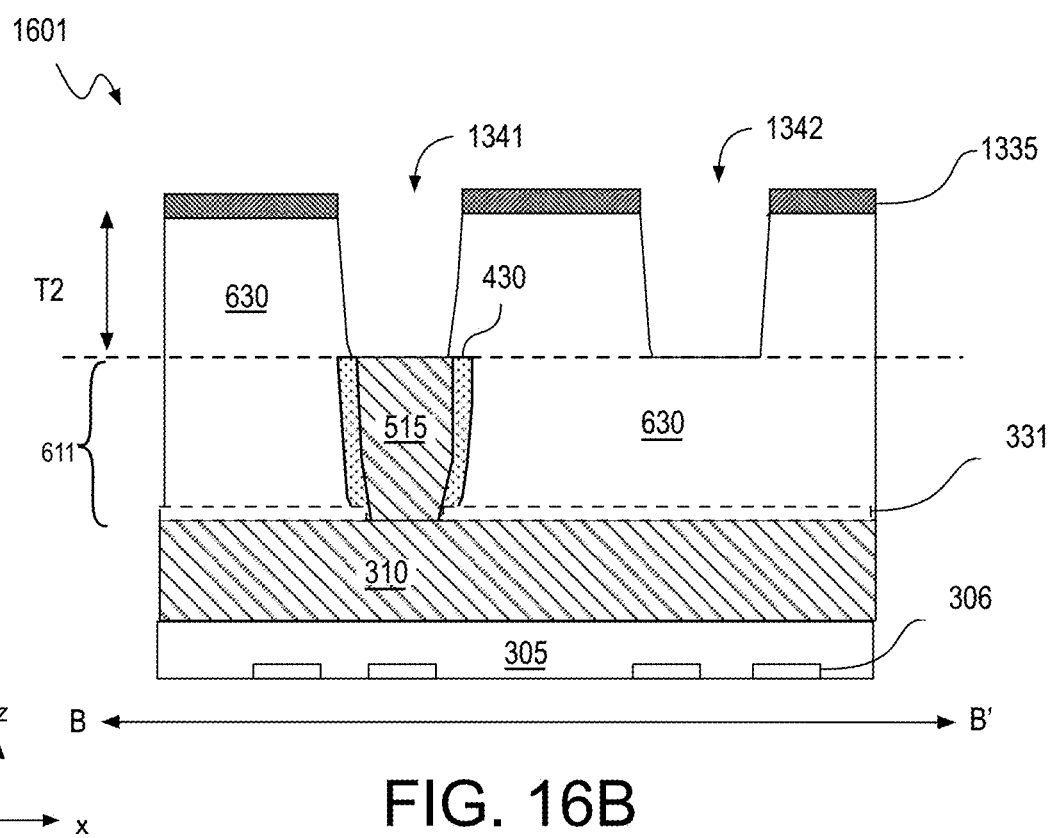
FIGS. 16B, 17B, and 18B illustrate a cross-sectional view of a portion of the IC interconnect structure illustrated in FIG. 16A-18A, in accordance with some embodiments.
Figure 17A:
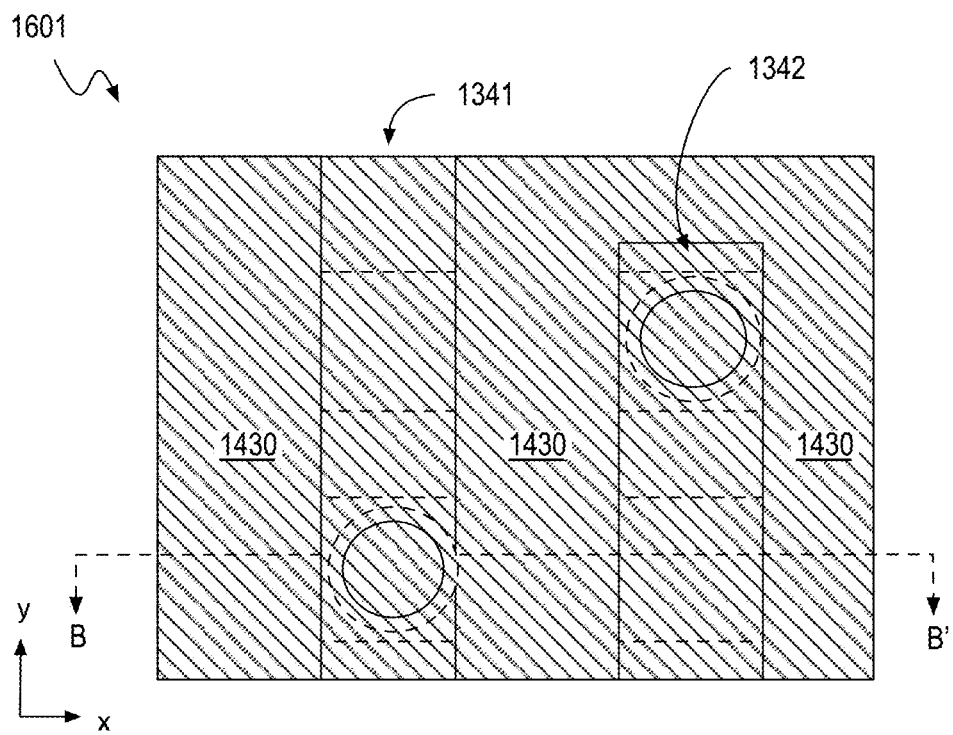
Figure 17B:
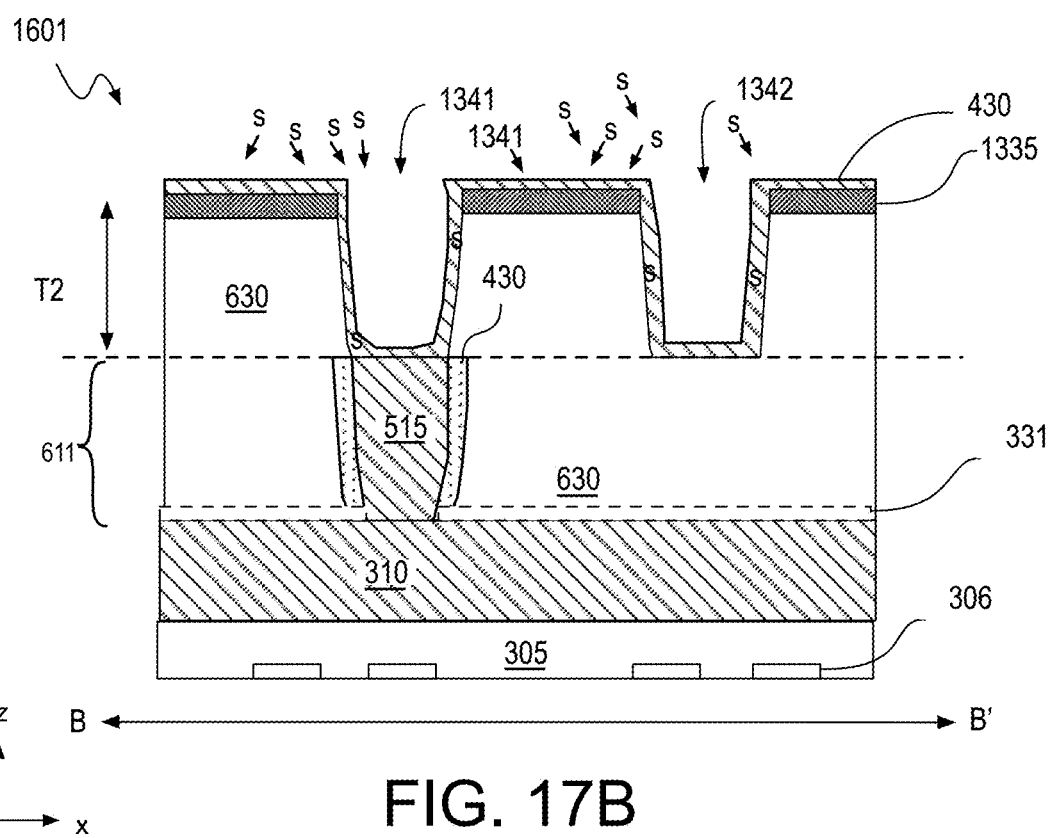
Figure 18A:
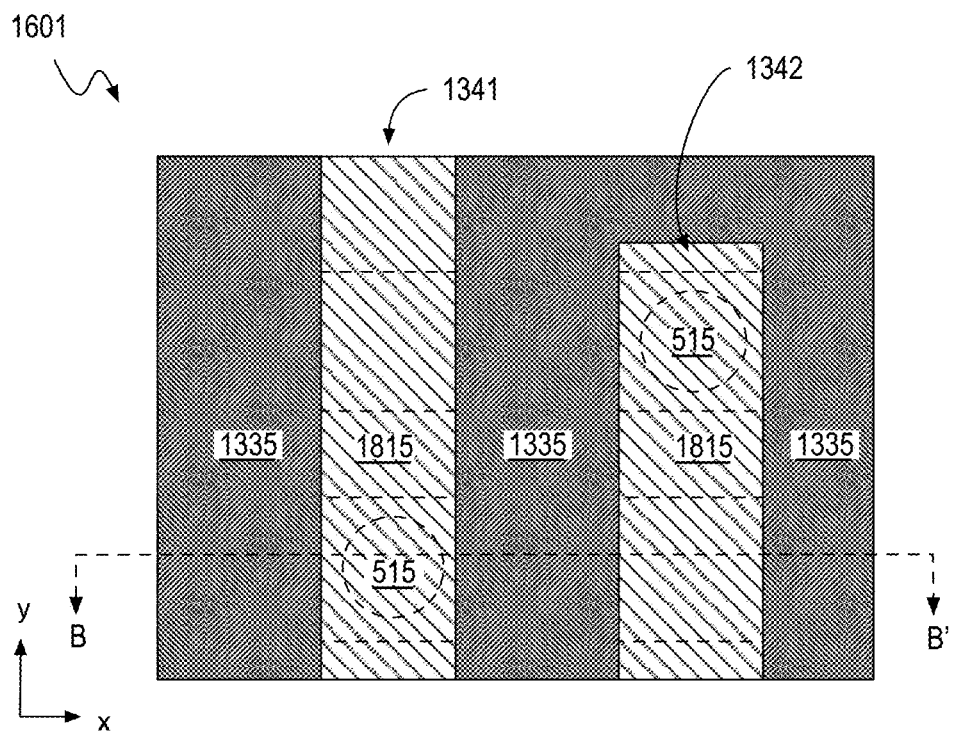

FIGS. 16A, 17A and 18A illustrate a plan view of a portion of an IC interconnect structure portion 1601 evolving as the methods 1201 are practiced, in accordance with some single-damascene embodiments. FIGS. 16B, 17B and 16B further illustrate a cross-sectional view of IC interconnect structure portion 1601 evolving, in accordance with some embodiments. Reference numbers introduced in the context of IC interconnect structure portions 301, 801 or 1301 are retained in FIG. 16-18 where the attributes and features previously described are directly applicable to IC interconnect structure portion 1601.

Referring first to FIG. 16A and FIG. 16B, interconnect structure portion 1601 includes an electrically conductive metallization feature 611 comprising fill metal 515 that is electrically coupled to underlying metallization feature 310. Metallization feature 611 may have been fabricated according to a first single-damascene process, for example. In this example, metallization feature 611 comprises a sidewall liner 430, substantially as described above. A top surface of metallization feature 611 is exposed at a bottom of trench opening 1341 patterned into dielectric materials 630. Separate patterning of metallization feature 611 and trench opening 1341 results in a non-zero lateral offset or profile discontinuity at the interface of the sidewall of trench opening 1341 and liner 430.

Figure 18B:
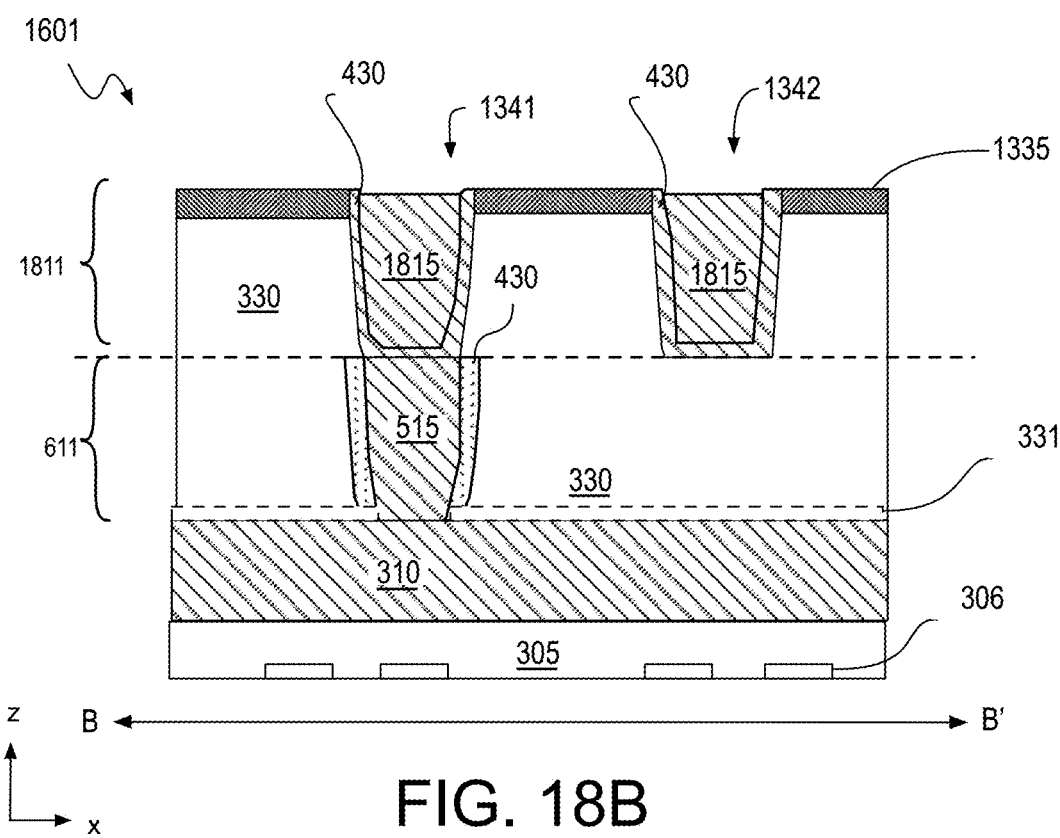

In the single-damascene example further illustrated in FIG. 17A and FIG. 17B, liner material 430 comprising a metal chalcogenide is within openings 1341, 1342 and in contact with metallization feature 515. Liner material 430 again has a thickness sufficient to function as at least one of an adhesion material layer or a diffusion barrier material layer. As shown in FIG. 18A and FIG. 18B, fill metal 1815 substantially backfills openings 1341 and 1342 to be planar with a top surface of the workpiece. IC interconnect structure portion 1601 is therefore illustrative of a single damascene structure associated with an interconnect metallization feature 611 fabricated separately from an overlying interconnect metallization feature 1811. Fill metal 1815 may therefore have a different chemical composition than fill metal 515. In some embodiments, for example, fill metal 1815 is predominantly Cu while fill metal 515 is predominantly a metal other than Cu (e.g., Ru, Mo, W, etc.). Likewise, liner 430 of metallization feature 611 may have a different chemical composition than liner 430 of metallization feature 1811. For example, metallization feature 1811 may comprise a Cu fill metal 1815 and a $CuS_x$ liner 430 while metallization feature 611 may comprise a Ru or W fill metal 515 with a $RuS_x$ or $WS_x$ liner 430.

Although not illustrated, any of the interconnect structure portions described may be augmented to further include a metal chalcogenide over the fill metal, for example to completely encapsulate a fill metal with metal chalcogenide. For such embodiments, a portion of the fill metal may be chalcogenated in substantially the same manner described above for a sacrificial backbone metal or precursor metal layer.

The interconnect structure portions described above may each be incorporated into any IC circuitry as a portion of any IC chip or die that may be singulated from a workpiece following the completion of any conventional processing. With a metal chalcogenide liner in accordance with embodiments herein, interconnect line metallization resistance may be reduced. IC circuitry may therefore display a lower RC delay and higher overall performance. The improvement in conductivity of metallization features may be further enhanced through cryogenic cooling of an IC die comprising such metallization features.

Figure 19A:
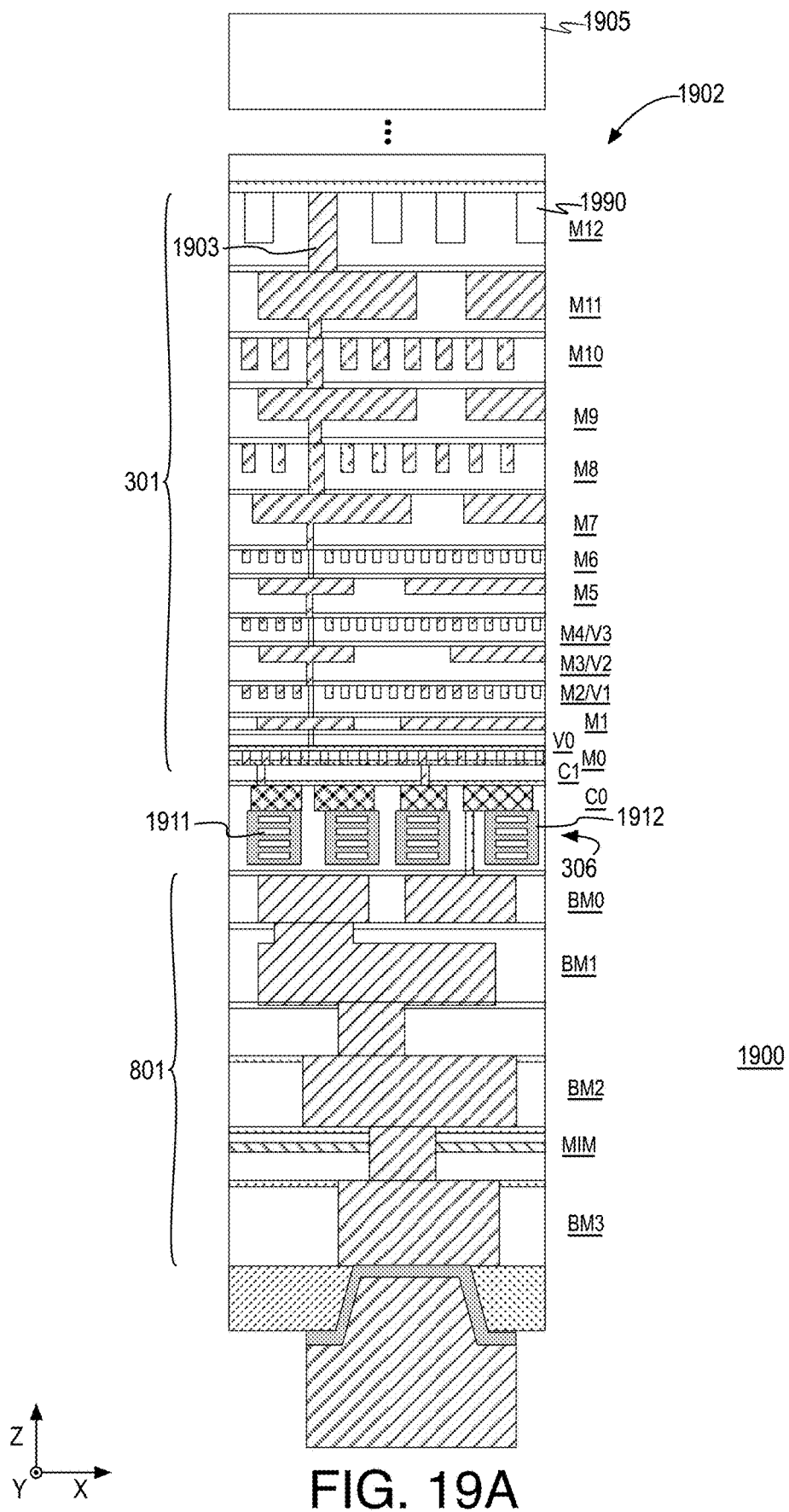
FIG. 19A illustrates a cross-sectional view of a low temperature integrated circuit system with die level active liquid phase cooling, in accordance with some embodiments.

FIG. 19A illustrates a cross-sectional view of a low temperature integrated circuit system with die-level active liquid phase cooling, in accordance with some embodiments. In IC system 1900, IC die 1902 includes liquid coolant conveyance structures or components to otherwise remove heat from IC die 1902 to achieve an operating temperature, for example below −25° C.

In IC system 1900, IC die 1902 includes die level active liquid cooling as provided by microchannels 1990. Microchannels 1990 are to convey a heat transfer fluid to remove heat from IC die 1902. The heat transfer fluid may be any suitable liquid or gas. In some embodiments, the heat transfer fluid has an operating window of at least −25° C. and preferably a cryogenic temperature operating window (e.g., about −70° C. to about −180° C.). In some embodiments, microchannels 1990 are to convey liquid nitrogen operable to lower the temperature of at least a portion of IC die 1902 to an operating temperature between −50° C. and −180° C. In some other embodiments, the microchannels 1990 are to convey one of helium-3, helium-4, hydrogen, neon, air, fluorine, argon, oxygen, or methane.

IC die 1902 may include multiple microchannels 1990 providing discrete channels or a network of interconnected channels. Microchannels 1990 may have any pattern in the x-y plane such as a serpentine pattern, or the like. Microchannels 1990 couple to a heat exchanger (not shown) external to IC die 1902 that removes heat from and cools the heat transfer fluid before its re-circulation through microchannels 1990. The flow of fluid within microchannels 1990 may be maintained by a pump or other means to provide a pressure differential between opposite ends of microchannels 1990. The operation of a heat exchanger, pump, etc. may be controlled by a controller, for example.

In the illustrated embodiment, microchannels 1990 are implemented at a metallization level M12. Metallization levels M0 through M11 may accordingly comprise IC interconnect structure portion 301, for example including a metal chalcogenide liner substantially as described elsewhere herein. Metallization levels M0 through M11 may also comprise any of IC interconnect structure portions 801 (FIG. 11B), 1301 (FIG. 15B), or 1601 (FIG. 18B), substantially as described elsewhere herein. Maintained at potentially cryogenic temperatures, conductivity of the metallization levels M0 through M11 may be far superior to their conductivity at standard temperature, or above. In particular, scatter resistance associated with metal chalcogenide liners may be reduced to far below the level the same material demonstrates at standard temperature, or above.

Microchannels 1990 may be formed using any suitable technique or techniques such as patterning and etch techniques to form voids followed by deposition, lamination or bonding techniques to enclose the voids. Microchannels 1990 may be adjacent to a metallization feature 1903. Metallization feature 1903 may be an interface to a package level interconnect structure associated with a package 1905.

As shown in FIG. 19A, levels of interconnect metallization features M0-M12 are over a front side of device structures 306, which in this example include stacked nanosheet transistors with a gate stack 1912 surrounding semiconductor material nanosheets 1911. Backside metallization levels BM0-BM3 are over a backside of device structures 306 and may couple electrical power into IC die 1902, for example. Backside metallization levels BM0 through M3 may comprise IC interconnect structure 801 (FIG. 13B), for example including a metal chalcogenide liner substantially as described elsewhere herein. Backside metallization levels BM0 through M3 may instead comprise any of IC interconnect structure portions 301 (FIG. 6B), 1301 (FIG. 15B), or 1601 (FIG. 18B), substantially as described elsewhere herein. Maintained at potentially cryogenic temperatures, conductivity of the backside metallization levels BM0 through BM11 may be far superior to their conductivity at standard temperature, or above. In particular, scatter resistance associated with metal chalcogenide liners may be reduced to far below the level the same material demonstrates at standard temperature, or above.

Figure 19B:
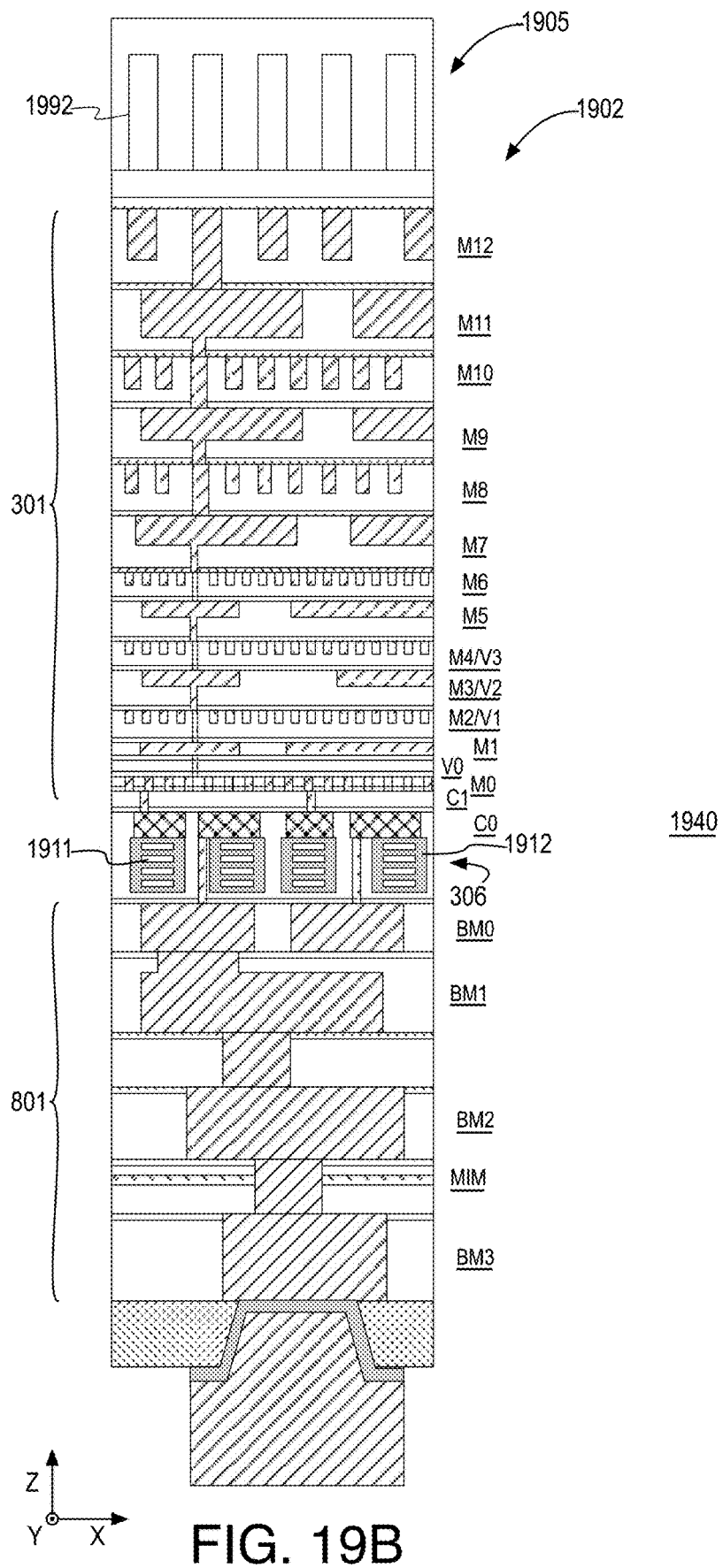
FIG. 19B illustrates a cross-sectional view of a low temperature integrated circuit system with package level active liquid phase cooling, in accordance with embodiments.

FIG. 19B illustrates a cross-sectional view of a low temperature integrated circuit system with package-level active liquid phase cooling, in accordance with embodiments. In IC system 1900, IC die 102 includes active cooling structures or components to remove heat from IC die 1902 to achieve an operating temperature of IC die 1902 at or below a target temperature such as −25° C. or any other operating or target temperature discussed herein.

In IC system 1900, IC die package 1905 include a liquid cooling structure having microchannels 1992. Microchannels 1992 are to similarly convey a heat transfer fluid to remove heat from IC die 1902. The heat transfer fluid may be any of the liquid or gas examples described as suitable for microchannels 1992. Microchannels 1992 are to couple to a heat exchanger (not shown) external of IC die package 1905. In the illustrated embodiment, package cooling structure 1905 is an active chiller that may be operable at cryogenic temperatures and mounted to IC die 1902 accordingly to any suitable techniques, such as a bonding or solder interconnection.

Figure 20:
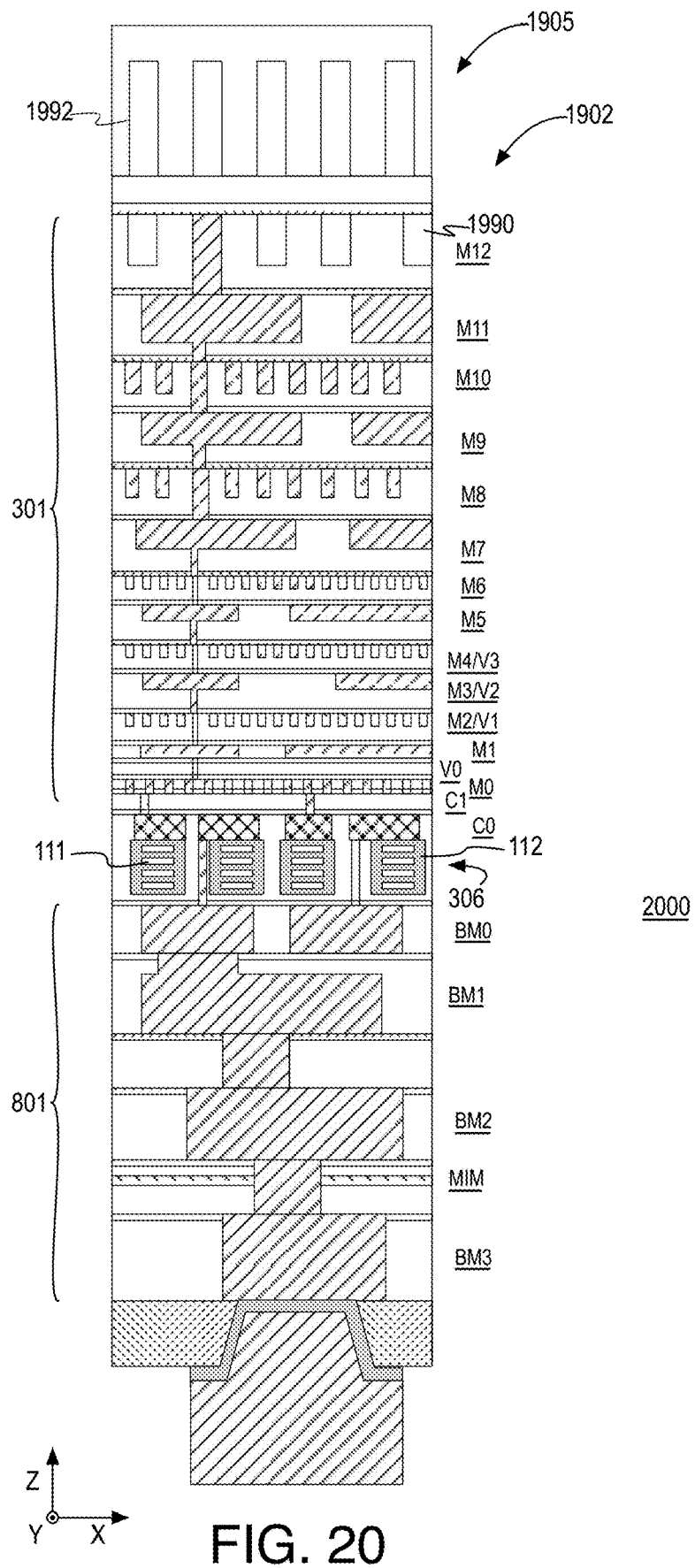
FIG. 20 illustrates a cross-sectional view of a low temperature integrated circuit system with die level and package level active liquid phase cooling, in accordance with embodiments.

FIG. 20 illustrates a cross-sectional view of a low temperature integrated circuit system 2000 having both die-level and package-level active liquid phase cooling, in accordance with embodiments. In IC system 2000, IC die 1902 includes active cooling structures or components as provided by both microchannels 1990 and package cooling structure 1905. In some embodiments, the heat transfer fluid deployed in microchannels 1990 and microchannels 1992 are coupled to the same pump and heat exchanger systems. In such embodiments, the heat transfer fluid conveyed in microchannels 1990 and 1992 are part of the same active cooling loop. In other embodiments, the heat transfer fluids in each of microchannels 1990 and 1992 are maintained as separate active cooling loops.

Figure 21:
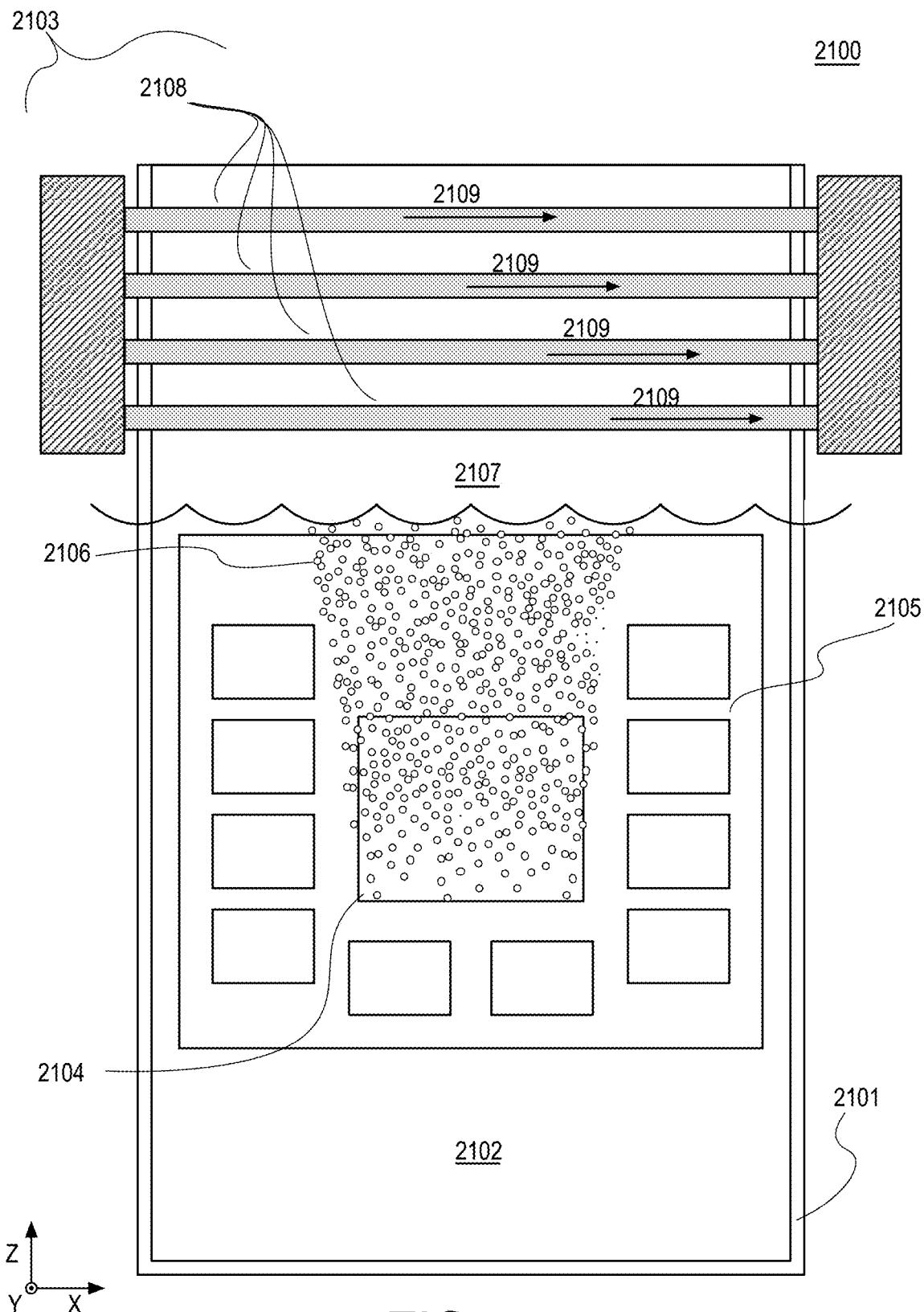
FIG. 21 illustrates a schematic of a liquid phase immersion cooling system for cryogenic operation of an integrated circuit die comprising interconnects with metal chalcogenide liners, in accordance with some embodiments.

FIG. 21 illustrates a schematic of a liquid phase immersion cooling system 2100 for cryogenic operation of an integrated circuit die comprising interconnects with metal chalcogenide liners, in accordance with some embodiments. As shown, two-phase immersion cooling system 2100 includes a fluid containment structure 2101, a low-boiling point liquid 2102 within fluid containment structure 2101, and a condensation structure 2103 at least partially within fluid containment structure 2101. As used herein, the term low-boiling point liquid indicates a liquid having a boiling point in the very low (e.g., cryogenic) temperature ranges above. In some embodiments, the low-boiling point liquid is one of nitrogen (LN2), helium-3, helium-4, hydrogen, neon, air, fluorine, argon, oxygen, or methane.

In operation, a heat source 2104 (such as an IC die or any of IC systems 1900, 1940, or 2100 described above) is immersed in low-boiling point liquid 2102. In some embodiments, IC die or IC systems deployed in two-phase immersion cooling system 1100 do not include fluid microchannels. In alternative embodiments, such die-level or package-level active cooling structures may be used in concert with two-phase immersion cooling system 2100. Hence, an IC die having interconnect metallization with metal chalcogenide liners, for example as described elsewhere herein, may be attached to a host substrate 2105. Host substrate 2105 may be coupled to a power supply (not shown) and may be partially or completely submerged in low-boiling point liquid 12102.

In operation, the heat produced by heat source 2104 vaporizes low-boiling point liquid 2102 illustrated as bubbles 2106, which may collect outside of low-boiling point liquid 2102 as a vapor portion 2107 within fluid containment structure 2101. Condensation structure 2103 may extend through vapor portion 2107. In some embodiments, condensation structure 2103 is a heat exchanger having tubes 2108 with a cooling fluid (i.e., a fluid colder than the condensation point of vapor portion 2107) flow 2109 through tubes 2108 to condense vapor portion 2107 back to low-boiling point liquid 2102.

Figure 22:
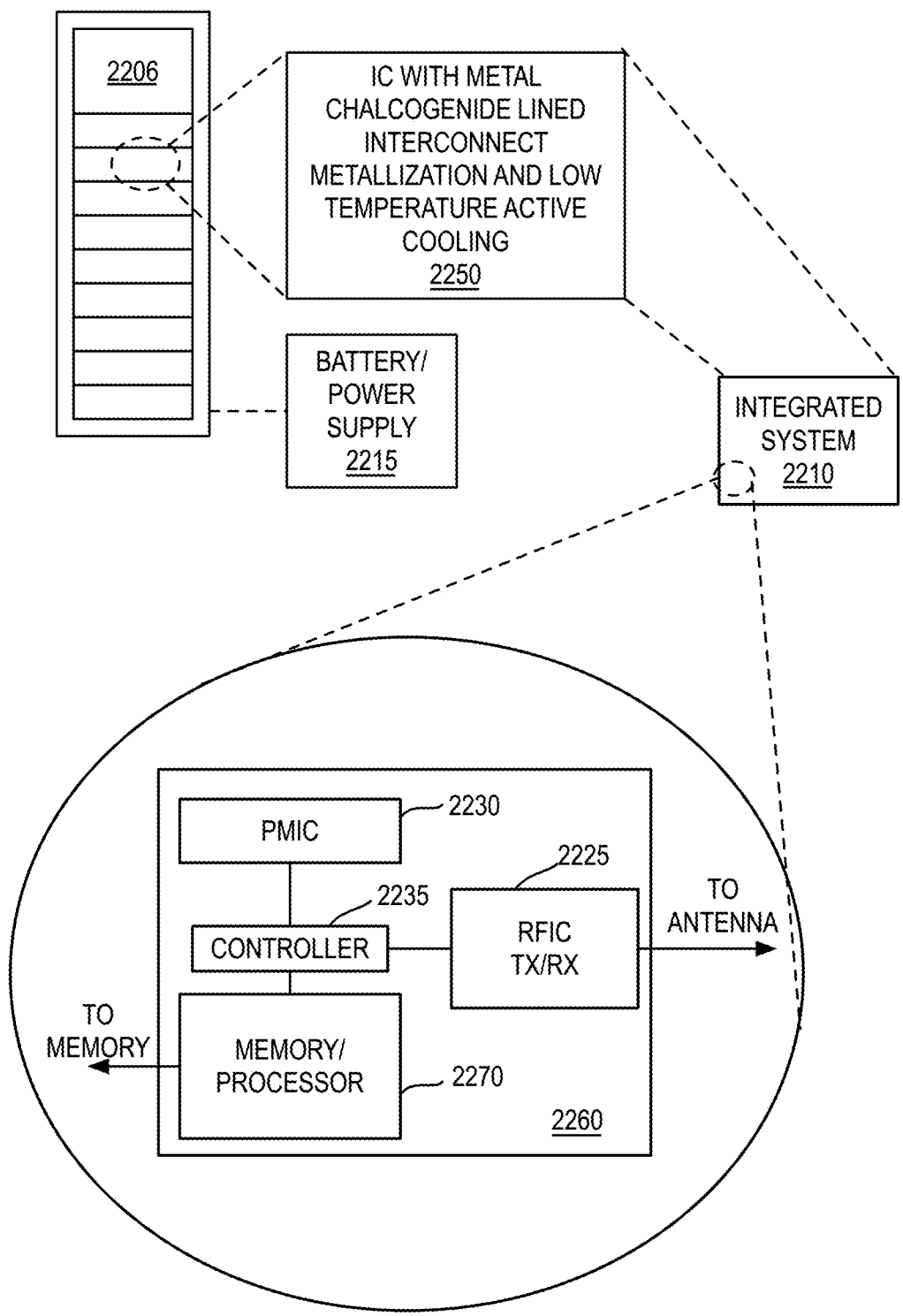
FIG. 22 illustrates a schematic of a data server machine including an actively liquid-phase cooled integrated circuit with metal chalcogenide lined interconnect metallization, in accordance with some embodiments.

FIG. 22 illustrates a schematic of a data server machine including an active liquid-phase cooled integrated circuit with metal chalcogenide lined interconnect metallization, in accordance with some embodiments. Server machine 2206 may be any commercial server, for example, including any number of high-performance computing platforms disposed within a rack and networked together for electronic data processing, which in the exemplary embodiment includes one or more devices 2250 having an integrated circuit with metal chalcogenide liner interconnect metallization features and low temperature active cooling operable to remove heat from the integrated circuit to achieve any low operating temperature discussed herein.

Also as shown, server machine 2206 includes a battery and/or power supply 2215 to provide power to devices 2250, and to provide, in some embodiments power delivery functions such as power regulation. Devices 2250 may be deployed as part of a package-level integrated system 2210. In the exemplary embodiment, integrated system 2210 includes an integrated circuitry 2270 (labeled "Memory/Processor") includes at least one memory array (e.g., RAM), and/or at least one processor core (e.g., a microprocessor, a multi-core microprocessor, or graphics processor, or the like) having the characteristics discussed herein. In an embodiment, integrated circuitry 2270 is a microprocessor including an SRAM cache memory. Integrated circuitry 2270 may include interconnect metallization structures and/or related characteristics discussed herein. Integrated circuitry 2270 may be further coupled to (e.g., communicatively coupled to) a board, a substrate, or an interposer 2260 along with, one or more of a power management integrated circuit (PMIC) 2230, RF (wireless) integrated circuit (RFIC) 2225 including a wideband RF (wireless) transmitter and/or receiver (TX/RX) (e.g., including a digital baseband and an analog front end module further comprises a power amplifier on a transmit path and a low noise amplifier on a receive path), and a controller 2235 thereof.

Figure 23:
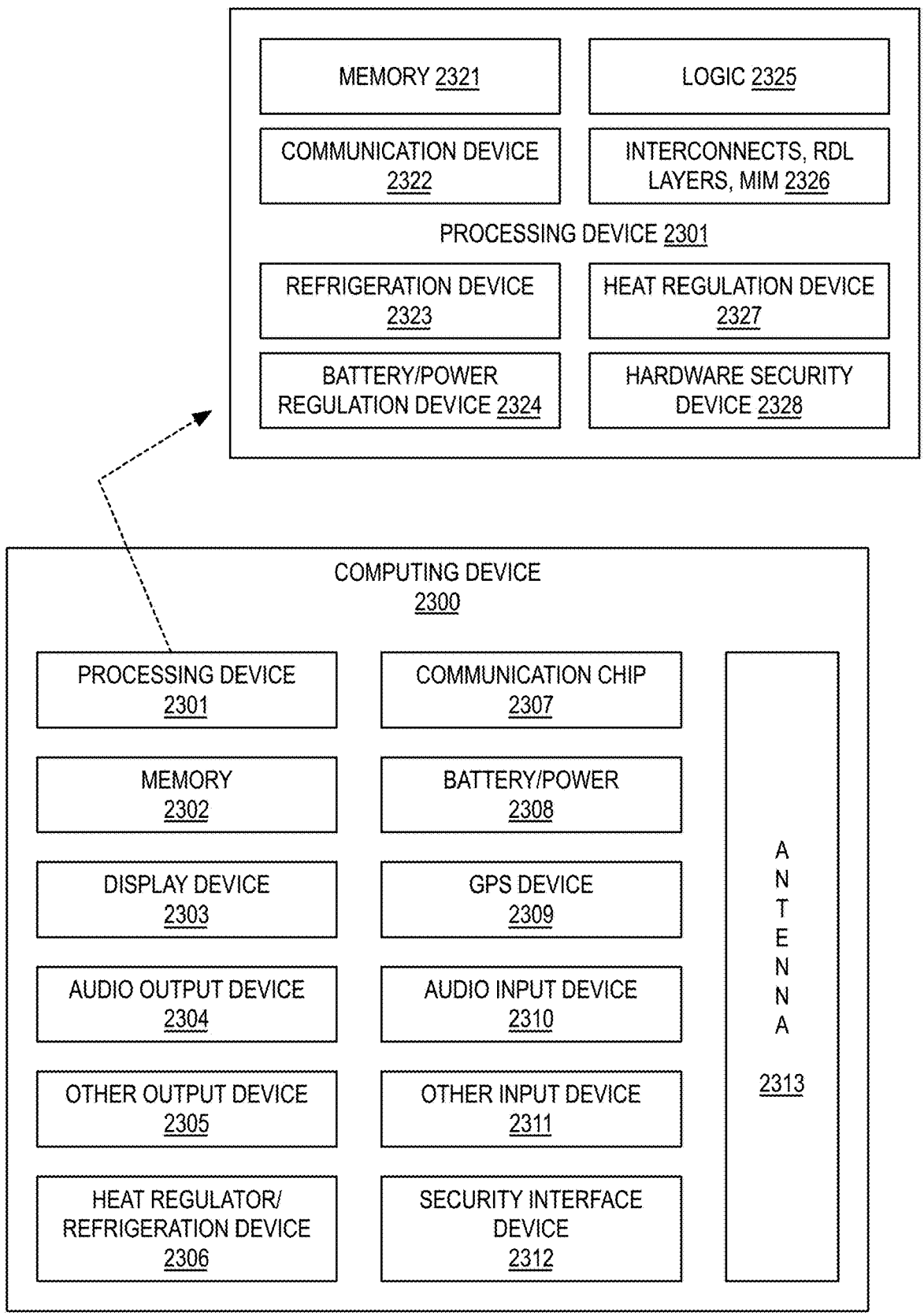
FIG. 23 is a block diagram of a cryogenically cooled computing device in accordance with some embodiments.

FIG. 23 is a block diagram of a cryogenically cooled computing device 2300 in accordance with some embodiments. For example, one or more components of computing device 2300 may include any of the devices or structures discussed elsewhere herein. A number of components are illustrated in FIG. 23 as included in computing device 2300, but any one or more of these components may be omitted or duplicated, as suitable for the application. In some embodiments, some or all of the components included in computing device 2300 may be attached to one or more printed circuit boards (e.g., a motherboard). In some embodiments, various ones of these components may be fabricated onto a single system-on-a-chip (SoC) die. Additionally, in various embodiments, computing device 2300 may not include one or more of the components illustrated in FIG. 23, but computing device 2300 may include interface circuitry for coupling to the one or more components. For example, computing device 2300 may not include a display device 2303, but may include display device interface circuitry (e.g., a connector and driver circuitry) to which display device 303 may be coupled.

Computing device 2300 may include a processing device 2301 (e.g., one or more processing devices). As used herein, the term processing device or processor indicates a device that processes electronic data from registers and/or memory to transform that electronic data into other electronic data that may be stored in registers and/or memory. Processing device 2301 may include a memory 2321, a communication device 2322, a refrigeration/active cooling device 2323, a battery/power regulation device 324, logic 2325, interconnects 2326 (i.e., optionally including redistribution layers (RDL) or metal-insulator-metal (MIM) devices), a heat regulation device 2327, and a hardware security device 2328.

Processing device 2301 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 2300 may include a memory 2302, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2302 includes memory that shares a die with processing device 2301. This memory may be used as cache memory and may include embedded dynamic random access memory (eDRAM) or spin transfer torque magnetic random-access memory (STT-M RAM).

Computing device 2300 may include a heat regulation/refrigeration device 1406. Heat regulation/refrigeration device 2306 may maintain processing device 2301 (and/or other components of computing device 2300) at a predetermined low temperature during operation. This predetermined low temperature may be any temperature discussed elsewhere herein.

In some embodiments, computing device 2300 may include a communication chip 2307 (e.g., one or more communication chips). For example, the communication chip 2307 may be configured for managing wireless communications for the transfer of data to and from computing device 2300. The term "wireless" and its derivatives may be used to describe circuits, devices, systems, methods, techniques, communications channels, etc., that may communicate data through the use of modulated electromagnetic radiation through a nonsolid medium.

Communication chip 2307 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 2307 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 2307 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2307 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2307 may operate in accordance with other wireless protocols in other embodiments. Computing device 2300 may include an antenna 2313 to facilitate wireless communications and/or to receive other wireless communications (such as AM or FM radio transmissions).

In some embodiments, communication chip 2307 may manage wired communications, such as electrical, optical, or any other suitable communication protocols (e.g., the Ethernet). As noted above, communication chip 2307 may include multiple communication chips. For instance, a first communication chip 2307 may be dedicated to shorter-range wireless communications such as Wi-Fi or Bluetooth, and a second communication chip 2307 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 2307 may be dedicated to wired communications.

Computing device 2300 may include battery/power circuitry 2308. Battery/power circuitry 1408 may include one or more energy storage devices (e.g., batteries or capacitors) and/or circuitry for coupling components of computing device 2300 to an energy source separate from computing device 2300 (e.g., AC line power).

Computing device 2300 may include a display device 2303 (or corresponding interface circuitry, as discussed above). Display device 2303 may include any visual indicators, such as a heads-up display, a computer monitor, a projector, a touchscreen display, a liquid crystal display (LCD), a light-emitting diode display, or a flat panel display, for example.

Computing device 2300 may include an audio output device 2304 (or corresponding interface circuitry, as discussed above). Audio output device 2304 may include any device that generates an audible indicator, such as speakers, headsets, or earbuds, for example.

Computing device 2300 may include an audio input device 2310 (or corresponding interface circuitry, as discussed above). Audio input device 2310 may include any device that generates a signal representative of a sound, such as microphones, microphone arrays, or digital instruments (e.g., instruments having a musical instrument digital interface (MIDI) output).

Computing device 2300 may include a global positioning system (GPS) device 2309 (or corresponding interface circuitry, as discussed above). GPS device 2309 may be in communication with a satellite-based system and may receive a location of computing device 2300, as known in the art.

Computing device 2300 may include another output device 2305 (or corresponding interface circuitry, as discussed above). Examples include an audio codec, a video codec, a printer, a wired or wireless transmitter for providing information to other devices, or an additional storage device.

Computing device 2300 may include another input device 2311 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2300 may include a security interface device 2312. Security interface device 2312 may include any device that provides security measures for computing device 2300 such as intrusion detection, biometric validation, security encode or decode, managing access lists, malware detection, or spyware detection, Computing device 2300, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

It will be recognized that embodiments are not limited to the specific examples described, but can be practiced with modification and alteration without departing from the scope of the appended claims. For example, the above embodiments may include specific combinations of features as further provided below.

In first examples, an integrated circuit (IC) interconnect structure comprises a first interconnect metallization feature and a second interconnect metallization feature over, and in contact with, the first interconnect metallization feature The second interconnect metallization feature comprises a bulk material comprising a metal, and a liner material comprising a metal and a chalcogen between a sidewall of the bulk material and a sidewall of an adjacent dielectric material. The liner material is absent from an interface between the first interconnect metallization feature and the second interconnect metallization feature.

In second examples, for any of the first examples the chalcogen comprises S or Se.

In third examples, for any of the first through second examples the bulk material comprises a first metal and the liner material comprises the first metal.

In fourth examples, for any of the third examples the first metal is Cu.

In fifth examples, for any of the first through fourth examples the bulk material comprises a first metal and the liner material comprises a second, different, metal.

In sixth examples, for any of the fifth examples the second metal comprises a transition metal.

In seventh examples, for any of the sixth examples the second metal is W.

In eighth examples, for any of the first through seventh examples the liner material has a thickness less than 6 nm.

In ninth examples, for any of the first through eighth examples the liner material has a different crystallinity than the bulk material.

In tenth examples, for any of the firth through ninth examples an integrated cooling structure is operable to remove heat from the IC interconnect structure to reach a temperature at or below −25° C.

In eleventh examples, for any of the tenth examples the integrated cooling structure comprises a plurality of microchannels over the IC interconnect structure, the microchannels to convey a heat transfer liquid therein to maintain a temperature no greater than −50° C.

In twelfth examples, a computer platform comprises a power supply, and an integrated circuit (IC) coupled to the power supply. The IC comprises a device layer comprising a plurality of transistors comprising one or more semiconductor materials and a plurality of interconnect levels. The interconnect levels further comprise a first interconnect metallization feature, and a second interconnect metallization feature over, and in contact with, the first interconnect metallization feature. The second interconnect metallization feature comprises a bulk material comprising a metal, and a liner material comprising a metal and a chalcogen between a sidewall of the bulk material and a sidewall of an adjacent dielectric material. The liner material is absent from an interface between the first interconnect metallization feature and the second interconnect metallization feature.

In thirteenth examples, for any of the twelfth examples the IC comprises a microprocessor.

In fourteenth examples, for any of the twelfth through thirteenth examples the chalcogen comprises S or Se, the bulk material comprises Cu, the liner material comprises Cu or W, and the liner material has a thickness less than 6 nm.

In fifteenth examples, a method of fabricating an integrated circuit (IC) interconnect structure comprises forming an opening through a backbone material, forming a liner on a sidewall of the opening by reacting, with a chalcogen, the backbone material or a seed layer material on the backbone material. The method comprises depositing a bulk material comprising a metal within the opening and in contact with the liner, and planarizing the bulk material with a surface of the backbone material.

In sixteenth examples, for any of the fifteenth examples the backbone material comprises a metal. Reacting the backbone material or the seed layer material with the chalcogen further comprises doping the backbone material with the chalcogen, and replacing a portion of the backbone material with a dielectric material.

In seventeenth examples, for any of the sixteenth examples the chalcogen comprises S, and doping the backbone material with the chalcogen comprises exposing a sidewall of the backbone material to a source gas comprising $H_2S$.

In eighteenth examples, for any of the sixteenth through seventeenth examples forming the opening further comprises exposing a stop layer material under the backbone material, and the method further comprises removing the stop layer material from a bottom of the opening after reacting the backbone material with the chalcogen.

In nineteenth examples, for any of the sixteenth examples the backbone material comprises a dielectric, the seed layer material comprises predominantly Cu, and reacting the backbone material or the seed layer material with the chalcogen further comprises doping the Cu with the chalcogen. The method further comprises depositing a bulk material comprising Cu within the opening.

In twentieth examples, for any of the fifteenth through nineteenth examples the method comprises forming microchannels within a dielectric material at a top level of the integrated circuit (IC) interconnect structure, the microchannels to convey a liquid at a temperature of less than −50° C.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
    a first interconnect metallization feature; and
    a second interconnect metallization feature over, and in contact with, the first interconnect metallization feature, wherein the second interconnect metallization feature comprises:
        a bulk material comprising a metal; and
        a liner material comprising a metal and a chalcogen between a sidewall of the bulk material and a sidewall of an adjacent dielectric material, wherein the chalcogen has a concentration within the liner material that is highest proximal to the bulk material and declines with increasing distance from the bulk material, and wherein the liner material is absent from an interface between the first interconnect metallization feature and the second interconnect metallization feature.

2. The IC interconnect structure of claim 1, wherein the chalcogen comprises S or Se.

3. The IC interconnect structure of claim 1, wherein the bulk material comprises a first metal and the liner material comprises the first metal.

4. The IC interconnect structure of claim 3, wherein the first metal is Cu.

5. The IC interconnect structure of claim 1, wherein the bulk material comprises a first metal and the liner material comprises a second, different, metal.

6. The IC interconnect structure of claim 5, wherein the second metal comprises a transition metal.

7. The IC interconnect structure of claim 6, wherein the second metal is W.

8. The IC interconnect structure of claim 1, wherein the liner material has a thickness less than 6 nm.

9. The IC interconnect structure of claim 1, wherein the liner material has a different crystallinity than the bulk material.

10. The IC interconnect structure of claim 1, further comprising an integrated cooling structure operable to remove heat from the IC interconnect structure to reach a temperature at or below −25° C.

11. The IC interconnect structure of claim 10, wherein the integrated cooling structure comprises a plurality of microchannels over the IC interconnect structure, the microchannels to convey a heat transfer liquid therein to reach a temperature no greater than −50° C.

12. A computer platform comprising:
    a power supply; and
    an integrated circuit (IC) coupled to the power supply, wherein the IC comprises:
        a device layer comprising a plurality of transistors comprising one or more semiconductor materials; and
        a plurality of interconnect levels, the interconnect levels further comprising the IC interconnect structure of claim 1.

13. The computer platform of claim 12, wherein the IC comprises a microprocessor.

14. The computer platform of claim 12, wherein:
    the chalcogen comprises S or Se;
    the bulk material comprises Cu;
    the liner material comprises W; and
    the liner material has a thickness less than 6 nm.

15. A method of fabricating an integrated circuit (IC) interconnect structure, the method comprising:
    forming an opening through a backbone material;
    forming a liner on a sidewall of the opening by reacting, with a chalcogen, the backbone material;
    depositing a bulk material comprising a metal within the opening and in contact with the liner; and planarizing the bulk material with a surface of the backbone material; and replacing a portion of the backbone material with a dielectric material.

16. The method of claim 15, wherein:

the backbone material comprises a first metal and the bulk material comprises a second metal.

17. The method of claim 16, wherein the chalcogen comprises S, and doping the backbone material with the chalcogen comprises exposing a sidewall of the backbone material to a source gas comprising $H_2S$.

18. The method of claim 16, wherein:

forming the opening further comprises exposing a stop layer material under the backbone material; and the method further comprises removing the stop layer material from a bottom of the opening after reacting the backbone material with the chalcogen.

19. A method, comprising:

forming a layer of comprising a first metal over a plurality of transistors;

forming an opening through the layer comprising the first metal;

forming a liner on a sidewall of the opening by reacting the layer comprising the first metal with a chalcogen;

depositing within the opening a material comprising a second metal;

planarizing the material comprising the second metal with a surface of the layer comprising the first metal; and replacing at least a portion of the layer comprising the first metal with a dielectric material.

20. The method of claim 19, wherein replacing at least the portion of the layer comprising the first metal with the dielectric material comprises:

etching an unreacted portion of the layer comprising the first metal;

depositing the dielectric material around the liner; and planarizing the dielectric material with a surface of the material comprising the second metal.

* * * * *